US010533080B2

(12) United States Patent
Kim et al.

(10) Patent No.: US 10,533,080 B2
(45) Date of Patent: Jan. 14, 2020

(54) TRANSFER PRINTING USING SHAPE MEMORY POLYMERS

(71) Applicant: The Board of Trustees of the University of Illinois, Urbana, IL (US)

(72) Inventors: Seok Kim, Champaign, IL (US); Jeffrey D. Eisenhaure, Champaign, IL (US)

(73) Assignee: The Board of Trustees of the University of Illinois, Urbana, IL (US)

(*) Notice: Subject to any disclaimer, the term of this patent is extended or adjusted under 35 U.S.C. 154(b) by 77 days.

(21) Appl. No.: 15/657,487

(22) Filed: Jul. 24, 2017

(65) Prior Publication Data
US 2018/0100046 A1 Apr. 12, 2018

Related U.S. Application Data

(60) Provisional application No. 62/366,669, filed on Jul. 26, 2016.

(51) Int. Cl.
*C08J 7/04* (2006.01)
*B05C 1/02* (2006.01)
(Continued)

(52) U.S. Cl.
CPC ............... *C08J 7/042* (2013.01); *B05C 1/025* (2013.01); *B05D 1/26* (2013.01); *B41J 2/475* (2013.01); *B81C 1/0046* (2013.01)

(58) Field of Classification Search
CPC ...................................................... C08J 7/042
(Continued)

(56) References Cited

U.S. PATENT DOCUMENTS 6,986,855 B1  1/2006 Hood et al.
7,927,976 B2  4/2011 Menard
(Continued)

FOREIGN PATENT DOCUMENTS

WO  WO2015184088 A1  5/2015

OTHER PUBLICATIONS

Ahmed, Numair et al., "Active Polymeric Composite Membranes for Localized Actuation and Sensing in Microtransfer Printing," *Journal of Microelectromechanical Systems*, 24, 4 (2015) pp. 1016-1028.
(Continued)

*Primary Examiner* — Anthony H Nguyen
(74) *Attorney, Agent, or Firm* — Brinks Gilson & Lione

(57) ABSTRACT

A method of transfer printing comprises globally heating an array of stamps, where each stamp comprises a shape memory polymer with a light absorbing agent dispersed therein, and pressing the array of stamps to a donor substrate comprising a plurality of inks. Each stamp is thereby compressed from an undeformed adhesion-off configuration to a deformed adhesion-on configuration. The array of stamps is then cooled to rigidize the shape memory polymer and bind the plurality of inks to the stamps in the deformed adhesion-on configuration. The plurality of inks remain bound to the stamps while the array of stamps is positioned in proximity with a receiving substrate. A selected stamp in the array is then locally heated using a concentrated light source. The selected stamp returns to the undeformed adhesion-off configuration, and the ink bound to the selected stamp is released and transfer printed onto the receiving substrate.

15 Claims, 24 Drawing Sheets
(4 of 24 Drawing Sheet(s) Filed in Color)

(51) Int. Cl.
  B05D 1/26    (2006.01)
  B41J 2/475   (2006.01)
  B81C 1/00    (2006.01)
(58) Field of Classification Search
  USPC ...................................................... 101/492
  See application file for complete search history.

(56) References Cited

U.S. PATENT DOCUMENTS

| | | | |
|---|---|---|---|
| 8,057,891 B2 | 11/2011 | Cheng et al. | |
| 8,062,568 B2 | 11/2011 | Lee | |
| 8,093,340 B2 | 1/2012 | Xie et al. | |
| 8,236,129 B2 | 8/2012 | Xie et al. | |
| 8,237,324 B2 | 8/2012 | Pei et al. | |
| 8,251,163 B2 | 8/2012 | Xie et al. | |
| 8,506,867 B2 | 8/2013 | Menard | |
| 8,628,838 B2 | 1/2014 | Xie et al. | |
| 8,685,528 B2 | 4/2014 | Xie et al. | |
| 9,358,775 B2 | 6/2016 | Bower et al. | |
| 9,704,821 B2* | 7/2017 | Meitl | B29C 59/002 |
| 2006/0057032 A1* | 3/2006 | Blok | B29C 66/21 422/400 |
| 2009/0199960 A1* | 8/2009 | Nuzzo | B82Y 10/00 156/230 |
| 2009/0289029 A1 | 11/2009 | Vecchione et al. | |
| 2010/0123268 A1 | 5/2010 | Menard | |
| 2010/0316845 A1 | 12/2010 | Rule et al. | |
| 2012/0314388 A1* | 12/2012 | Bower | H01L 21/563 361/760 |
| 2013/0069275 A1 | 3/2013 | Menard et al. | |
| 2013/0273695 A1* | 10/2013 | Menard | H01L 21/6835 438/118 |
| 2013/0302464 A1 | 11/2013 | Zheng et al. | |
| 2014/0069578 A1 | 3/2014 | Xie et al. | |
| 2015/0352586 A1* | 12/2015 | Kim | B05C 1/02 427/256 |

OTHER PUBLICATIONS

Al-okaily, Ala'a M. et al., "Multi-physics modeling for laser micro-transfer printing delamination," *Journal of Manufacturing Processes*, 20 (2015) pp. 414-424.
Bhaswara, A. et al., "Fabrication of nanoplate resonating structures via micro-masonry," *J. Micromech. Microeng.*, 24, 115012 (2014) pp. 1-8.
Carlson, Andrew et al., "Active, Programmable Elastomeric Surfaces with Tunable Adhesion for Deterministic Assembly by Transfer Printing," *Adv. Funct. Mater.*, 22 (2012) pp. 4476-4484.
Carlson, Andrew et al., "Transfer Printing Techniques for Materials Assembly and Micro/Nanodevice Fabrication," *Advanced Materials*, 24 (2012) pp. 5284-5318.
Eisenhaure, Jeffrey D. et al., "The Use of Shape Memory Polymers for MEMS Assembly," *Journal of Microelectromechanical Systems*, 25, 1 (2016) pp. 69-77.
Eisenhaure, Jeffrey et al., "An Internally Heated Shape Memory Polymer Dry Adhesive," *Polymers*, 6 (2014) pp. 2274-2286.
Fan, Zhiyong et al., "Large-scale, heterogeneous integration of nanowire arrays for image sensor circuitry," *PNAS*, 105, 32 (2008) pp. 11066-11070.
Huang, Jan-Chan et al., "Carbon Black Filled Conducting Polymers and Polymer Blends," *Advances in Polymer Technology*, 21, 4 (2002) pp. 299-313.
Huang, Jan-Chan et al., "Processability, Mechanical Properties, and Electrical Conductivities of Carbon Black-Filled Ethylene-Vinyl Acetate Copolymers," *Advances in Polymer Technology*, 19, 2 (2000) pp. 132-139.
Jeong, Bongwon et al., "Complex nonlinear dynamics in the limit of weak coupling of a system of microcantilevers connected by a geometrically nonlinear tunable nanomembrane," *Nanotechnology*, 25, 465501 (2014) pp. 1-16.
Kanari, Katsuhiko et al., "Thermal Conductivity of Epoxy Resins Cured with Aliphatic Amines," *Polymer Journal*, 4, 4 (1974) pp. 372-378.
Kim, Dae-Hyeong et al., "Materials for Multifunctional Balloon Catheters with Capabilities in Cardiac Electrophysiological Mapping and Ablation Therapy," *Nat. Mater.*, 10, 4 (2011) pp. 316-323.
Kim, Seok et al., "Microstructured elastomeric surfaces with reversible adhesion and examples of their use in deterministic assembly by transfer printing," *PNAS*, 107, 40 (2010) pp. 17095-17100.
Kim, Tae-il et al., "Thin Film Receiver Materials for Deterministic Assembly by Transfer Printing," *Chemistry of Materials*, 26, 14 (2014) pp. 3502-3507.
Loebich, Otto, "The Optical Properties of Gold—A Review of Their Technical Utilisation," *Gold Bull.* 5 (1972) pp. 2-10.
Meitl, Matthew A. et al., "Transfer printing by kinetic control of adhesion to an elastomeric stamp," *Nature Materials*, 5 (2006) pp. 33-38.
Saeidpourazar, Reza et al., "A prototype printer for laser driven micro-transfer printing," *Journal of Manufacturing Processes*, 14 (2012) pp. 416-424.
Saeidpourazar, Reza et al., "Laser-Driven Micro Transfer Placement of Prefabricated Microstructures," *Journal of Microelectromechanical Systems*, 21, 5 (2012) pp. 1049-1058.
Viventi, Jonathan et al., "A Conformal, Bio-interfaced Class of Silicon Electronics for Mapping Cardiac Electrophysiology," *Sci. Transl. Med.*, 2, 24 (2010) pp. 1-15.
Xie, Tao et al., "Facile tailoring of thermal transition temperatures of epoxy shape memory polymers," *Polymer*, 50 (2009) pp. 1852-1856.
Xue, Yeguang et al., "A theoretical model of reversible adhesion in shape memory surface relief structures and its application in transfer printing," *J. Mech. Phys. Solids*, 77 (2015) pp. 27-42.
Yang, Yumi et al., "Arrays of Silicon Micro/Nanostructures Formed in Suspended Configurations for Deterministic Assembly Using Flat and Roller-Type Stamps," *Small*, 7, 4 (2011) pp. 484-491.
Yang, Zining et al., "A Tip-Tilt-Piston Micromirror with an Elastomeric Universal Joint Fabricated via Micromasonry," *Journal of Microelectromechanical Systems*, 24, 2 (2015) pp. 262-264.
Berger, M., "Microfabrication Inspired by Lego," *NanoWerk* (2013) pp. 1-3.
Carlson, Andrew et al., "Active, Programmable Elastomeric Surfaces with Tunable Adhesion for Deterministic Assembly by Transfer Printing," *Advanced Functional Materials*, 22 (2012), pp. 4476-4484.
Carlson, Andrew et al., "Shear-enhanced adhesiveless transfer printing for use in deterministic materials assembly," *Applied Physics Letters*, 98 (2011), pp. 264104-1-264104-3.
Dechev, Nikolai et al., "Microassembly of 3-D Microstructures Using a Compliant, Passive Microgripper," *Journal of Microelectromechanical Systems*, 13, 2 (Apr. 2004), pp. 176-189.
Eisenhaure, J. et al., "Aphid Foot Inspired Reversible Dry Adhesives," Abstract from 2012 MRS Fall Meeting in Boston, MA, Nov. 28, 2012, 1 page.
Eisenhaure, J. et al., "Micro-Structured Shape Memory Polymer Based Stamps with Controllable Adhesion," Abstract from ASME 2012 International Mechanical Engineering Congress & Exposition (IMECE) in Houston, TX, Nov. 9-15, 2012, 1 page.
Eisenhaure, J. et al., "Microstructured Shape Memory Polymer Surfaces with Reversible Adhesion," Presentation from International Mechanical Engineering Conference & Exposition (IMECE) in Houston, TX, Nov. 13, 2012, pp. 1-15.
Eisenhaure, J. et al., "Microstructured Shape Memory Polymer Surfaces with Reversible Adhesion," Presentation from Materials Research Society (MRS) Fall Meeting in Boston, MA, Nov. 28, 2012, pp. 1-11.
Eisenhaure, J., "Microstructured Shape Memory Polymer Surfaces with Reversible Dry Adhesion," *ACS Appl. Mater. Interfaces* 5 (2013) pp. 7714-7717.
Fuchiwaki, Ohmi et al., "Multi-axial Micromanipulation Organized by Versatile Micro Robots and Micro Tweezers," *2008 IEEE International Conference on Robotics and Automation*, Pasadena, CA, USA, May 19-23, 2008, pp. 893-898.

(56) References Cited

OTHER PUBLICATIONS

Haliyo, D. Sinan et al., "Advanced applications using [mü]MAD, the adhesion based dynamic micro-manipulator," *Proceedings of the 2003 IEEE/ASME International Conference on Advanced Intelligent Mechatronics* (AIM 2003), pp. 880-885.

Jeong, Jae-Woong et al., "Two-axis MEMS scanner with transfer-printed high-reflectivity, broadband monolithic silicon photonic crystal mirrors," *Optics Express*, 21, 11 (Jun. 3, 2013), pp. 13800-13809.

Keum, Hohyun et al., "Silicon micro-masonry using elastomeric stamps for three-dimensional microfabrication," *Journal of Micromechanics and Microengineering*, 22 (2012) 055018 (7 pp).

Kim, S. et al., "Microstructured Elastomeric Surfaces with Reversible Adhesion and Examples of Their Use in Deterministic Assembly by Transfer Printing," *PNAS*, 107, 40 (2010) pp. 17095-17100.

Kim, S. et al., "Reversible Dry Micro-Fibrillar Adhesives with Thermally Controllable Adhesion," *Soft Matter*, 5 (2009) pp. 3689-3693.

Kim, Seok et al., "Enhanced adhesion with pedestal-shaped elastomeric stamps for transfer printing," *Applied Physics Letters*, 100 (2012), pp. 171909-1-171909-4.

Liu, C. et al., "Review of Progress in Shape-Memory Polymers," *J. Mater. Chem.*, 17 (2007) pp. 1543-1558.

Meitl, Matthew A. et al., "Transfer printing by kinetic control of adhesion to an elastomeric stamp," *Nature Materials*, 5 (Jan. 2006), pp. 33-38.

Mengüç, Yiğit et al., "Gecko-Inspired Controllable Adhesive Structures Applied to Micromanipulation," *Advanced Functional Materials*, 22 (2012) pp. 1246-1254.

Miyazaki, Hideki T. et al., "Adhesion of micrometer-sized polymer particles under a scanning electron microscope," *Journal of Applied Physics*, 88, 6 (Sep. 15, 2000), pp. 3330-3340.

Saeidpourazar, Reza et al., "Laser-Driven Micro Transfer Placement of Prefabricated Microstructures," *Journal of Microelectromechanical Systems*, 21, 5 (Oct. 2012), pp. 1049-1058.

Saito, Shigeki et al., "Non-impact deposition for electrostatic micromanipulation of a conductive particle by a single probe," *Journal of Micromechanics and Microengineering*, 18 (2008), 107001 (3 pp).

Spearing, S. M., "Materials Issues in Microelectromechanical Systems (MEMS)," *Acta Materialia*, 48 (2000) pp. 179-196.

Volk, B., "Characterization of Shape Memory Polymers," NASA Langley Research Centre, Texas A&M University (2005) 11 pages.

Wanka, Stefanie et al., "Measuring Adhesion Forces in Powder Collectives by Inertial Detachment," *Langmuir*, 29 (2013), pp. 16075-16083.

Xie, Tao et al., "Self-Peeling Reversible Dry Adhesive System," *Chem. Mater.*, 20 (2008), pp. 2866-2868.

Yang, Sang Yoon et al., "Elastomer Surfaces with Directionally Dependent Adhesion Strength and Their Use in Transfer Printing with Continuous Roll-to-Roll Applications," *Advanced Materials*, 24 (2012), pp. 2117-2122.

Zhang, Yong et al., "Autonomous Robotic Pick-and-Place of Microobjects," *IEEE Transactions on Robotics*, 26, 1 (Feb. 2010), pp. 200-207.

Zhang, Yong et al., "Micro-Masonry of MEMS Sensors and Actuators," *Journal of Microelectromechanical Systems*, 23, 2 (Apr. 2014), pp. 308-314.

\* cited by examiner

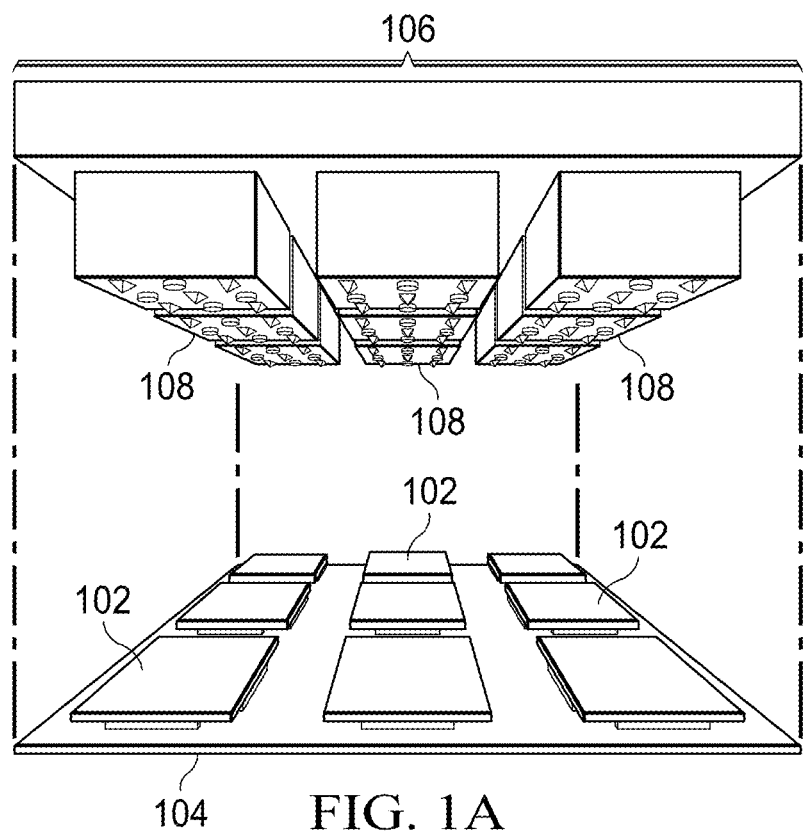
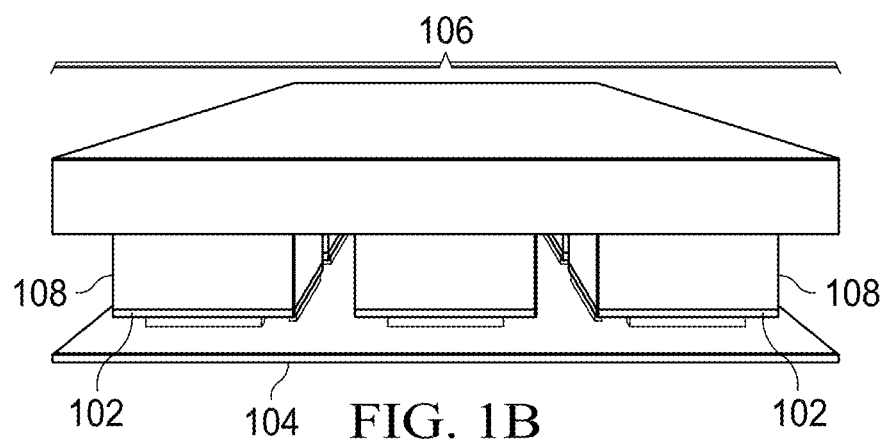

TRANSFER PRINTING USING SHAPE MEMORY POLYMERS

RELATED APPLICATIONS

The present patent document claims the benefit of priority under 35 U.S.C. § 119(e) to U.S. Provisional Patent Application No. 62/366,669, filed on Jul. 26, 2016, which is hereby incorporated by reference in its entirety.

FEDERALLY SPONSORED RESEARCH OR DEVELOPMENT

This invention was made with government support under CMMI 1435521 awarded by National Science Foundation. The government has certain rights in the invention.

TECHNICAL FIELD

The present disclosure is related generally to shape memory polymers and more particularly to a transfer printing process utilizing shape memory polymers.

BACKGROUND

Transfer printing encompasses a set of assembly techniques which have experienced growing utility and popularity in recent years, offering unique capabilities in integration, assembly and fabrication of micro/nanomaterials. Three distinct categories of transfer may be defined: additive, subtractive, and deterministic assembly; the last of these methods is particularly powerful due to its natural compatibility with high performance, single crystalline semiconductor materials (such as Si, GaAs, GaN, InP, etc.). In general terms, deterministic assembly by transfer printing refers to a diverse set of protocols for the assembly of pre-fabricated solid components, which may be referred to as "inks" arrayed on a donor substrate, onto a separate receiver substrate to produce one or many functional devices.

BRIEF SUMMARY

According to one embodiment, a method of transfer printing comprises globally heating an array of stamps, where each stamp comprises a shape memory polymer with a light absorbing agent dispersed therein, and pressing the array of stamps to a donor substrate comprising a plurality of inks. Each stamp is thereby compressed from an undeformed adhesion-off configuration to a deformed adhesion-on configuration. The array of stamps is then cooled to rigidize the shape memory polymer and bind the plurality of inks to the stamps in the deformed adhesion-on configuration. The plurality of inks remain bound to the stamps while the array of stamps is positioned in proximity with a receiving substrate. A selected stamp in the array is then locally heated using a concentrated light source. The selected stamp returns to the undeformed adhesion-off configuration, and the ink bound to the selected stamp is released and transfer printed onto the receiving substrate.

A stamp array for transfer printing comprises an array of stamps, where each stamp in the array comprises a shape memory polymer including a light absorbing agent dispersed therein.

According to another embodiment, the method of transfer printing comprises globally heating an array of stamps, where each stamp comprises a shape memory polymer, and pressing the array of stamps to a donor substrate comprising a plurality of inks. Each stamp is thereby compressed from an undeformed adhesion-off configuration to a deformed adhesion-on configuration. The array of stamps is then cooled to rigidize the shape memory polymer and bind the plurality of inks to the stamps in the deformed adhesion-on configuration. The plurality of inks remain bound to the stamps while the array of stamps is positioned in proximity with a receiving substrate. A selected stamp in the array is then locally heated. The selected stamp returns to the undeformed adhesion-off configuration, and the ink bound to the selected stamp is released and transfer printed onto the receiving substrate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A-1H show steps in an exemplary laser-driven transfer printing process utilizing an array of shape memory polymer (SMP) stamps, each including a light-absorbing agent dispersed therein.

In FIG. 10B, a second layer of Si inks is printed on a first layer of Si inks, and in FIG. 10C, a 4×4 array of Si inks is printed in two parallel print steps, with a 45 degree rotation between them. Optical images of the demonstrations in FIGS. 10B and 10C are shown in FIGS. 10D and 10E, respectively.

DETAILED DESCRIPTION

A method of achieving selective-printing in a large 2D array format, with minimal restriction on ink packing density and a high speed of activation, has been developed. The method is enabled by the use of a shape memory polymer (SMP) as the functional stamp material. The solution demonstrated here includes locally heating SMP stamps using, in one example, a concentrated light source such as a near infrared (NIR) laser to deliver the heating necessary for stamp activation and thus selective-printing of inks.

Figures 1, 1C:
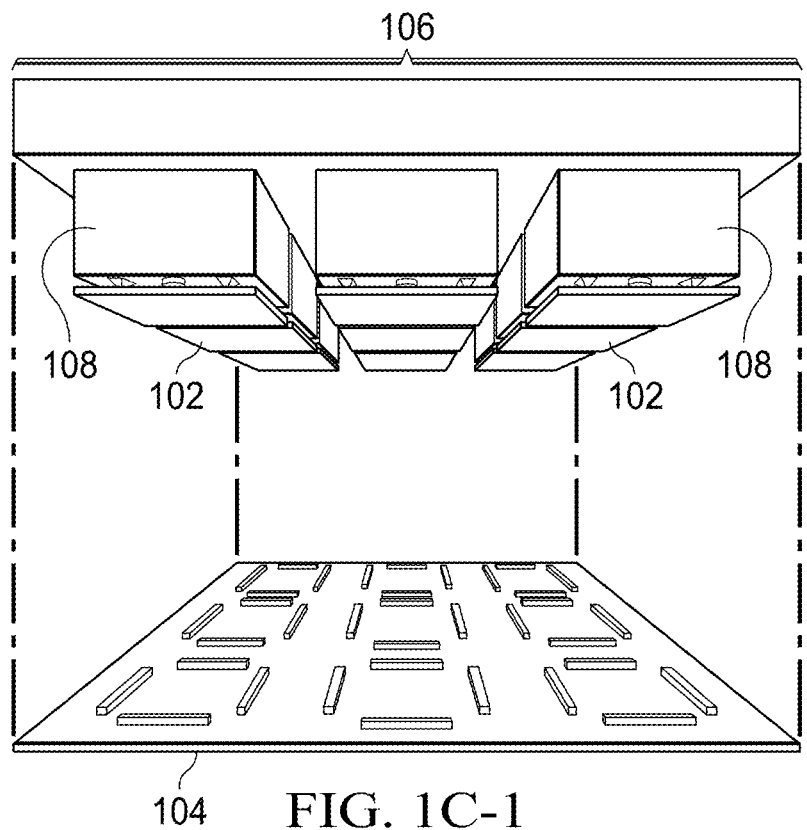

FIGS. 1A-1H show exemplary steps of the transfer printing method, which allows for pick-up of large arrays of inks followed by transfer printing of selected inks. Referring to FIG. 1A, prior to transfer printing, a plurality of inks or micro-objects 102 comprising any desired material, as discussed below, may be prefabricated or positioned on a donor substrate 104. A stamp array for transfer printing includes an array 106 of stamps 108, where each stamp 108 in the array 106 comprises a shape memory polymer having a glass transition temperature $T_g$ and including a light absorbing agent dispersed therein. The stamps may thus be described as comprising a shape memory polymer (SMP) composite. The stamp array is a two-dimensional array that may include from a few to hundreds or thousands of stamps 108.

Referring to FIG. 1B, the method entails heating the array 106 of stamps 108 to the glass transition temperature $T_g$ of the shape memory polymer or higher. Typically, all of the stamps 108 in the array 106 are heated during this step of the method; thus, it may be referred to as global heating of the array 106 in contrast to localized heating of selected stamp(s), which occurs later in the process. During or after the heating, the array 106 of stamps 108 is pressed to a donor substrate 104 comprising a plurality of inks 102, such that each stamp 108 is compressed from an undeformed "adhesion-off" configuration to a deformed "adhesion-on" configuration.

Figures 1, 1C, 2:
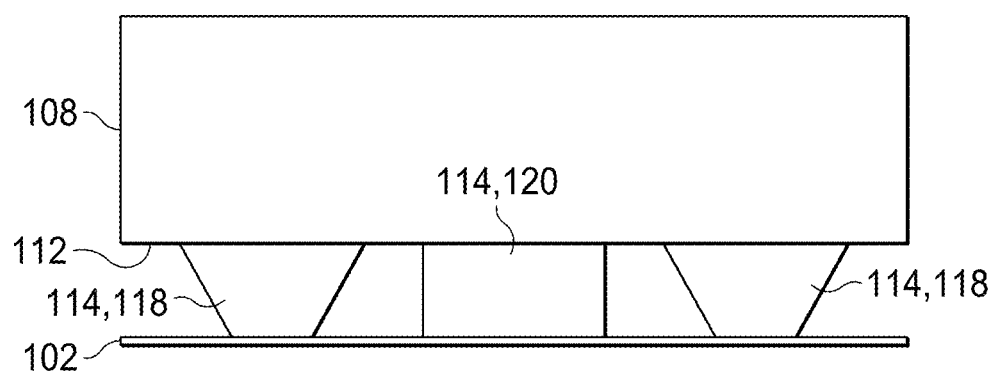

The array 106 of stamps 108 is then cooled below the glass transition temperature $T_g$ of the shape memory polymer in order to rigidize the shape memory polymer and bind the plurality of inks 102 to the stamps 108 in the array 106. Ink pick-up may be achieved when the the array 106 of stamps 108 is removed from the donor substrate 104, as illustrated in FIGS. 1C-1 and 1C-2.

Figure 1D:
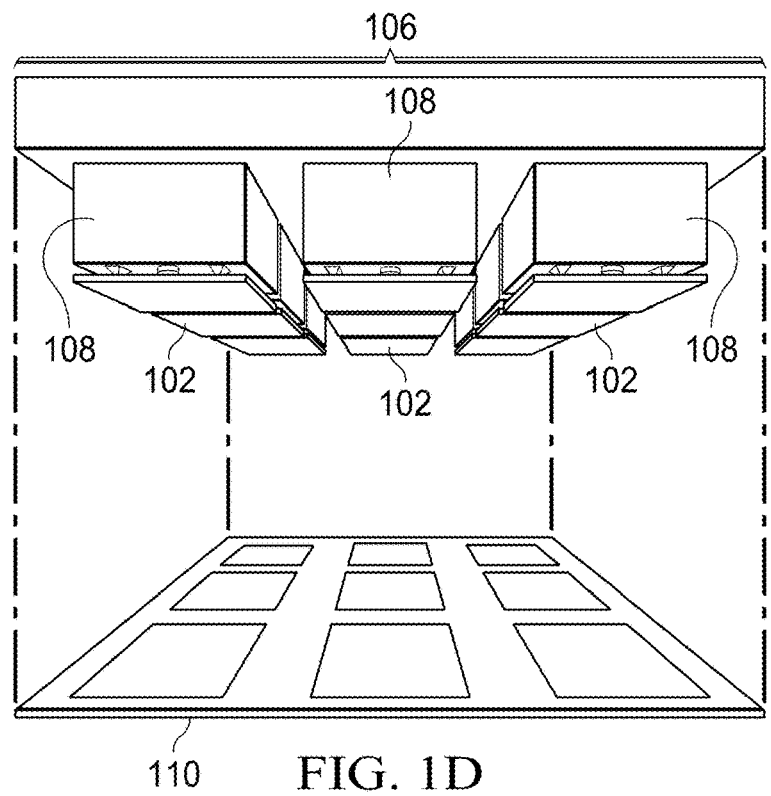

Referring to FIG. 1D, the array 106 of stamps 108 is positioned in proximity with a receiving substrate 110. During the positioning, which may entail translation and/or rotation of the array 106, the plurality of inks 102 remain bound to the stamps 108. It is believed that van der Waals forces are responsible for the binding of the inks 102 to the stamps 108. The array 106 of stamps 108 may be positioned directly above the receiving substrate 110 for transfer printing.

Figure 1E:
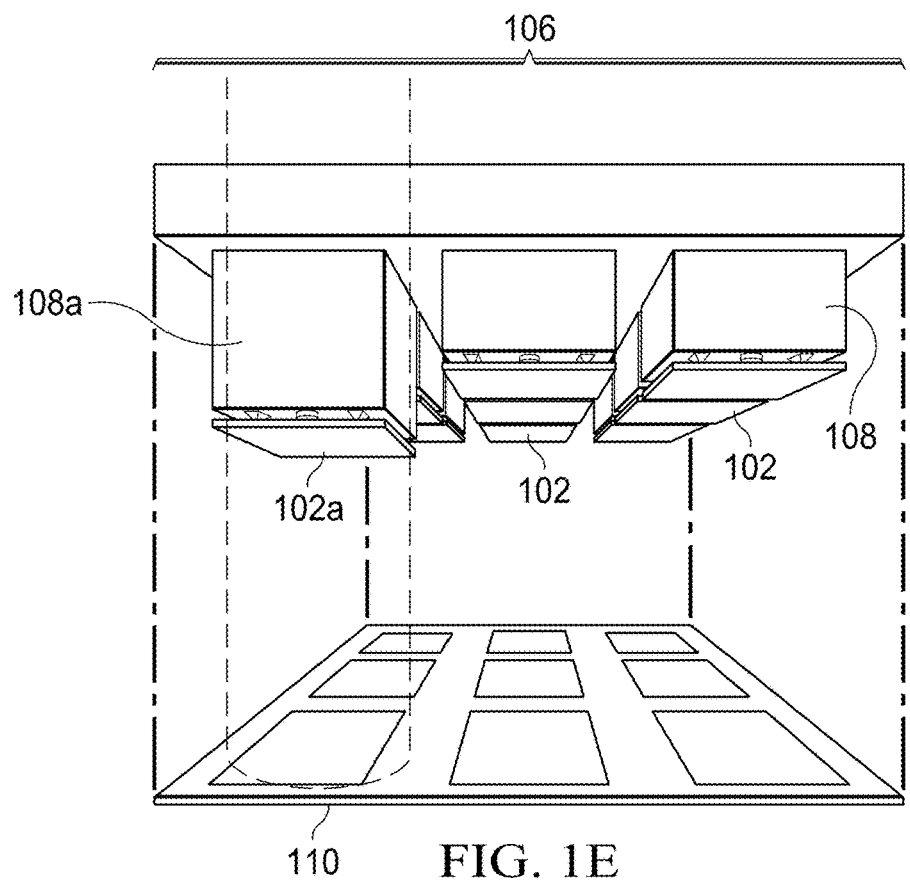
Figures 1, 1F:
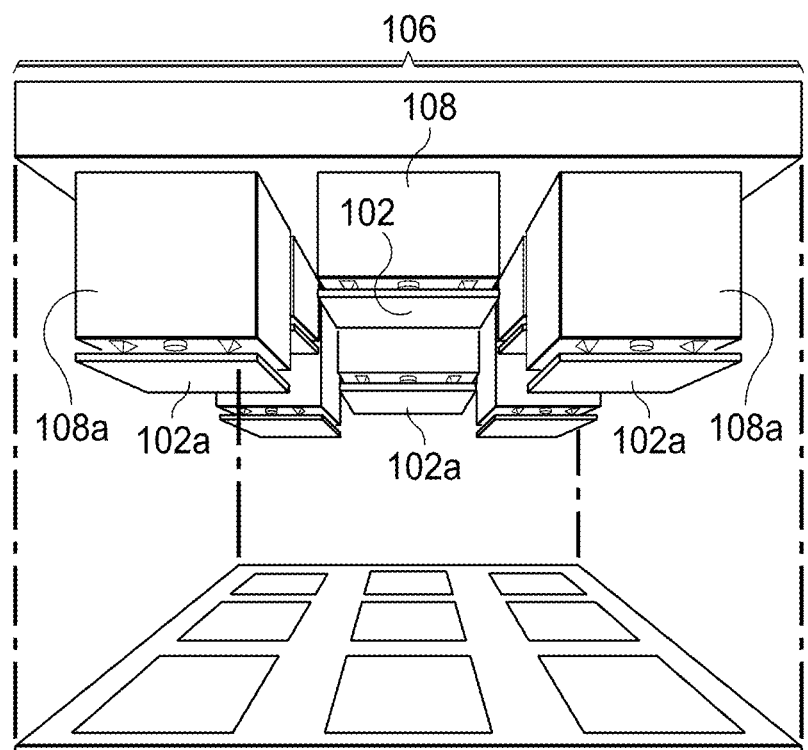
Figures 1, 1F, 2:
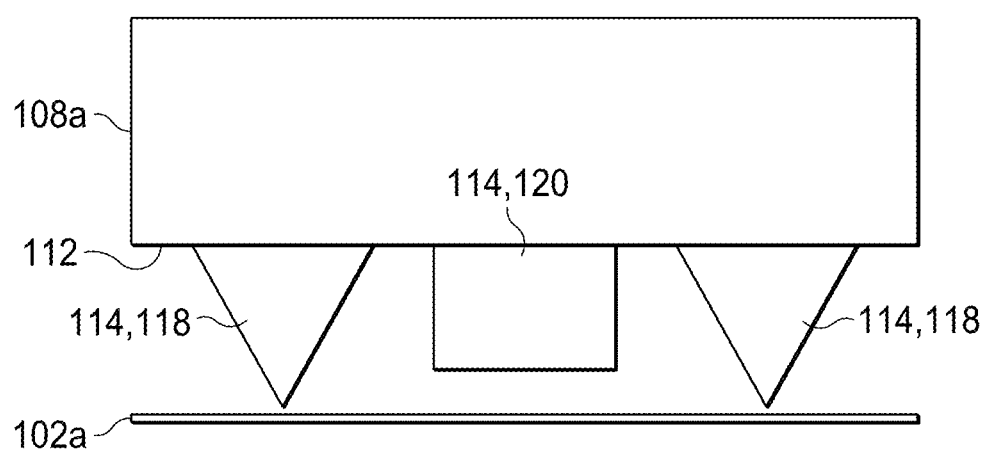
Figure 1G:
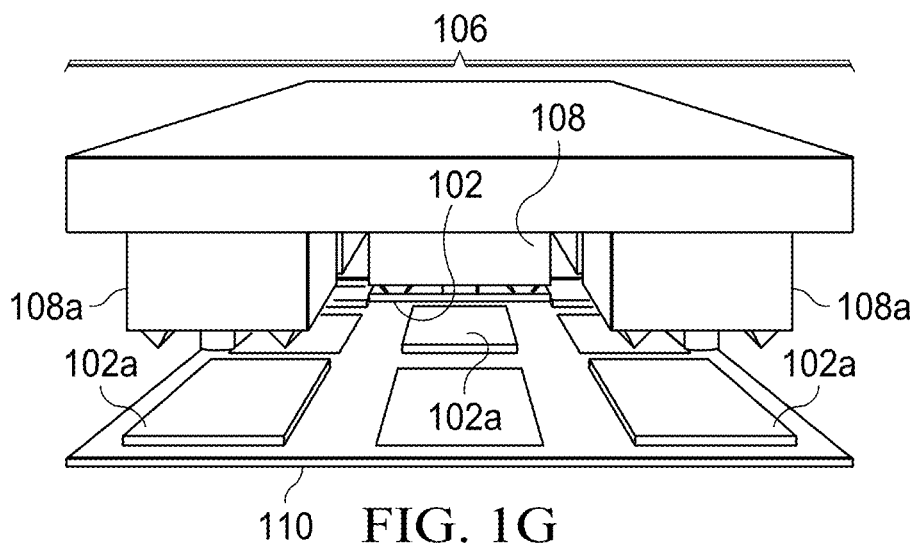
Figure 1H:
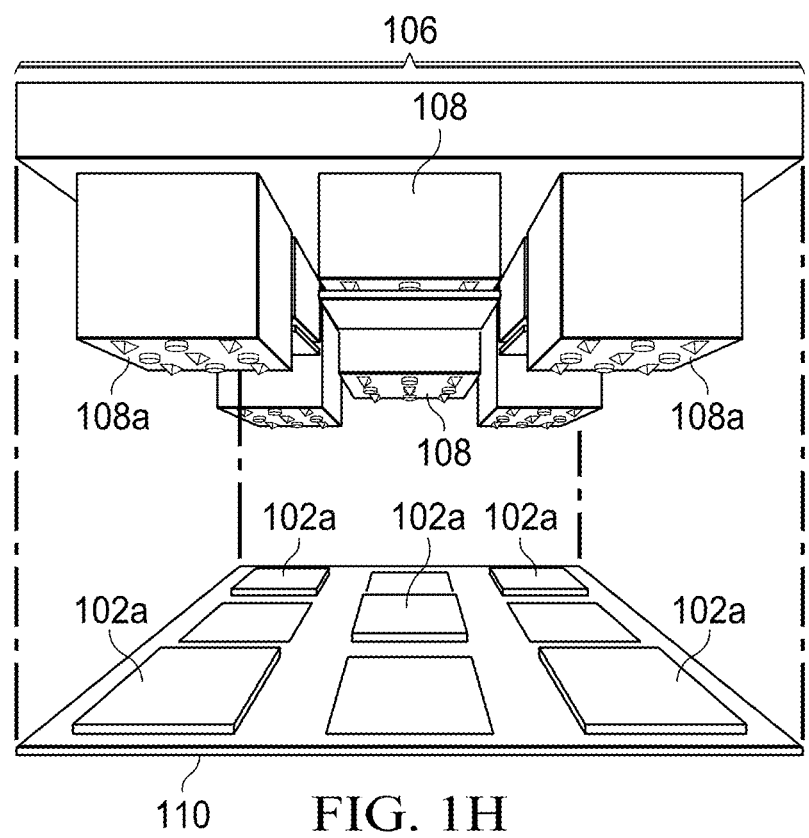

A selected stamp 108a in the array 106 undergoes localized heating to at least the glass transition temperature $T_g$ of the shape memory polymer using a concentrated light source, such as a laser, as illustrated in FIG. 1E. Light from the concentrated light source is absorbed by the light absorbing agent dispersed in the selected stamp, thereby effecting the localized heating. The laser or other concentrated light source may be rastered to heat additional selected stamps 108a in the array 106, as indicated in FIG. 1F-1. As a consequence of the localized heating, the selected stamp(s) 108a return to the undeformed adhesion-off configuration, and the ink(s) 102a bound to the selected stamp(s) 108a are released and transfer printed onto the receiving substrate 110, as illustrated in FIG. 1G. Other stamps 108 in the array 106 that have not been locally heated remain in the deformed adhesion-on configuration, and the inks 102 bound to those stamps 108 are not released. Thus, the process described above allows for massively parallel ink pick-up combined with selective transfer printing to obtain a desired pattern or arrangement of objects on the receiving substrate 110, as shown in FIG. 1H Many varieties of shape memory polymers (SMPs) have been developed, but the class of SMPs of most relevance to transfer printing include thermosensitive crosslinked SMPs with a thermal transition defined by the glass transition temperature $T_g$. Examples of exemplary transparent shape memory polymers include, but are not limited to, chemically crosslinked glassy thermosets and semicrystalline rubbers based on polyepoxide, polyeurethane, poly(ethylene-co-vinyl acetate), polycyclooctene chemistry, and polycaprolactone. The shape memory polymer may be attached to a structural support material, such as glass. The size and shape of the stamp is not limited. SMP-based transfer printing has been previously described and demonstrated for serial-print mode processes, as set forth for example in U.S. Patent Application Publication 2015/0352586, which is hereby incorporated by reference in its entirety.

The glass transition temperature $T_g$ of the shape memory polymer may be above room temperature (e.g., where room temperature is understood to be from about 20° C. to about 25° C.). For example, the glass transition temperature $T_g$ may lie in a range from about 30° C. to about 70° C., or in the range from about 40° C. to about 60° C. The shape memory polymer used for the examples in this disclosure is an epoxy-based SMP that has several attractive characteristics, including a convenient and tailorable $T_g$ (~40° C.), excellent shape fixity and recovery factors (>96%), a large storage modulus ratio between glassy and rubbery states (~400:1), and optical transparency. The narrow glass transition region near but above room temperature enables rapid thermal activation of the SMP, requires only passive cooling, and minimizes the negative effects of temperature rise in the system, including possible damage to inks and thermal expansion of the stamp and surrounding structures.

The global heating of the array 106 discussed in reference to FIG. 1B may comprise resistive heating, radiant heating (e.g., using infrared radiation) or convective heating (e.g., using a heat gun). In one example, resistive heating may be carried out using a resistive heating element embedded in, disposed adjacent to (e.g., attached to), or otherwise in thermal contact with a backside of the array of stamps. The resistive heating element may be, for example, a conductive wire, a patterned conductive film, or a network of conductive particles.

The local heating may entail illuminating the selected stamp in the array with radiation (such as near-infrared radiation) from a laser. The radiation may be pulsed radiation, and the laser may be rastered in order to locally heat more than one stamp in the array and enable transfer printing of multiple inks. As indicated in the schematic of FIG. 1E, the concentrated light source may be disposed behind the array of stamps. The shape memory polymer is preferably light-transmissive to allow the light to penetrate the stamp. For example, the epoxy-based SMP employed in the examples is highly transparent to at least a portion of the near-infrared (NIR) spectrum (e.g., radiation with a peak wavelength at 807 nm). To enable the localized heating, a high percentage of the light transmitted through the shape memory polymer, such as at least about 95%, is absorbed by the light absorbing agent dispersed in the shape memory polymer. The amount of energy required from the concentrated light source to reach a particular temperature required to activate the stamp may depend on the $T_g$ and modulus ratio of the shape memory polymer. For example, the temperature of the light absorbing agent may be raised to within a range from about 60° C. to about 120° C., enabling heating of the surrounding shape memory polymer to a temperature in the range from about 60° C. to about 120° C. The spacing (or pitch) of the stamps in the array may be determined by the spot size of the concentrated light source. More specifically, the spacing of the stamps may be at least as large as the spot size. The SMP-based system is largely insensitive to heating rate, and thus the laser may be operated at a relatively low power level in a range of about 50 mW to about 200 mW, for example, depending on the beam width and other factors. Generally speaking, the laser may be operated at a low power per unit area of about 150 mW·mm$^{-2}$ to 600 mW·mm$^{-2}$.

It is also contemplated that the local heating of the selected stamp may be carried out via resistive heating instead of radiant heating using a concentrated light source. Thus, the method as set forth above may be carried out without the light absorbing agent dispersed in the shape memory polymer, and without using the concentrated light source. Instead, in one example, an addressable electrically conductive heating element may be embedded in, attached to, positioned adjacent to, or otherwise fabricated in thermal contact with each stamp in the array. Localized heating of a selected stamp (or stamps) in the array may be effected by passing current through the respective electrically conductive heating element(s). The electrically conductive heating elements may comprise thin metal films (e.g., copper, gold, nickel, chromium, and alloys) between approximately 10 nm and 1 µm in thickness, deposited and patterned through well-established microfabrication techniques. Other patternable conductive materials including but not limited to graphene, carbon nanotubes, indium tin oxide, fluorine-doped tin oxide, and doped zinc oxide may similarly be used for the electrically conductive heating elements. Each of the electrically conductive heating elements may have a lateral size or area approximately equal to or less than that of the respective stamp. The array of electrically conductive heating elements may be designed to activate in sequence and/or in parallel. According to this example, a stamp array for transfer printing may comprise an array of stamps, where each stamp in the array comprises a shape memory polymer and includes an addressable electrically conductive heating element in thermal contact with each stamp in the array. The shape memory polymer may have any of the characteristics set forth in this disclosure, and the electrically conductive heating element may have any of the characteristics set forth above.

Light absorbing agents can be any material that can absorb energy from a concentrated light source, for example, a laser, light concentrated with mirrors and lenses, and the like, to locally heat the surrounding shape memory polymer. The light absorbing agent may take the form of carbon black (carbon particles), carbon fibers, organic and/or inorganic absorption pigments, and/or dyes. Carbon black may be suitable as a light absorbing agent due to its strong NIR absorption and its common use as an additive in polymer composites. It is also contemplated that the shape memory polymer itself may have laser absorbing properties, thus obviating the need for separate absorbing additives. Absorption of the laser energy within the stamp—as opposed to by the ink—enables operation independent of ink material and geometry, and ensures that heat is confined to the desired regions of the stamp. The light absorbing agent may be embedded within the shape memory polymer near to a surface of the stamp that contacts the ink. The light absorbing agent may further be localized to raised surface features of the stamp, as described below.

As shown in FIGS. 1C-2 and 1F-2, an ink-facing surface 112 of each stamp 108 may include a plurality of raised surface features 114 integrally formed with or attached to the stamp 108. The raised surface features 114 may comprise the shape memory polymer. The raised surface features 114 may promote release of the ink when the stamp 108 is in the undeformed adhesion-off configuration and may reduce the energy required to compress the stamp 108 into the deformed adhesion-on configuration. The raised surface features 114 may comprise microtips 118 having a pyramidal, conical or hemispherical morphology in the undeformed adhesion-off configuration of the stamp 108, as can be seen in FIG. 1F, or a flattened pyramidal, conical or hemispherical morphology in the deformed adhesion-on configuration, as can be seen in FIG. 1C. The raised surface features 114 may also or alternatively comprise drums 120 having a cylindrical or rectangular morphology in the undeformed adhesion-off configuration, and a flattened cylindrical or rectangular morphology in the deformed adhesion-on configuration.

The light absorbing agent dispersed within the shape memory polymer may be localized to the raised surface features 114, and more specifically, to surface regions of the raised surface features 114. A schematic illustrating this localization may be found in FIG. 2G-2, where the raised surface features 114 include the light absorbing agent 264 at the surface regions. Localization of the light absorbing agent to the raised surface features 114 ensures that the entire ink-facing surface 112 is not opaque, thereby allowing for better process visualization from behind the stamp array through the shape memory polymer. Thus, the raised surface features 114 serve the dual purpose of providing a controllable means of adhesion reversal, and a means of localizing the light absorbing agent to the ink-facing surface 112 without significantly impeding visibility through the stamp 108. With a relatively high areal density of raised surface features 114 on the ink-facing surface 112 (e.g., about 50% or greater), the surface 112 may be uniformly heated by the light absorbing agent during illumination.

A robust and versatile transfer printing platform has been developed which enables both serial and parallel printing to be performed, greatly improving potential throughput over existing printing methods. Using a shape memory polymer as the active stamp material is crucial to the system's operation because it enables rapid and passive stamp-ink adhesion reversal to print an individual ink without disturbing adjacent inks, as described above. The minimum size and spacing of the stamps, and therefore the inks, is limited only by the system's ability to localize heat generation and accompanying temperature rise within the stamp material. Laser-based heating methods may be superior due to the speed and ease with which they may precisely target the active stamp material with large power delivery, and when paired with an electronic rastering system can be relatively easily programmed to drive a variety of stamp and ink configurations. By embedding light absorbing agents that can absorb the laser light and become heated, among which carbon black is shown to be an excellent performer, within the SMP matrix, the speed and localization of heat delivery may be greatly enhanced.

As indicated above, there are no fundamental limits on the material(s) that may be employed for the inks. Generally speaking, the inks can be any class of material, including inorganic semiconductors, metals, carbon, colloids, organic and biological materials. They can be prepared in many physical forms (e.g., block, membrane, sphere). They can be light absorbing or non-light absorbing.

The present disclosure also provides a stamp comprising a memory shape polymer having a plurality of light absorbing agents embedded throughout the shape memory polymer and a plurality of inks on its surface. These stamps can be separately fabricated with an array of different inks on the surface, or custom ink arrays made to suit a user's needs, and then sent to the user for their particular transfer printing needs.

FIGS. 2A-2G depict the configuration of and fabrication process for an exemplary array of SMP composite stamps, where the SMP composite of this example is a carbon black-shape memory polymer (CBSMP).

Figures 1, 2A:
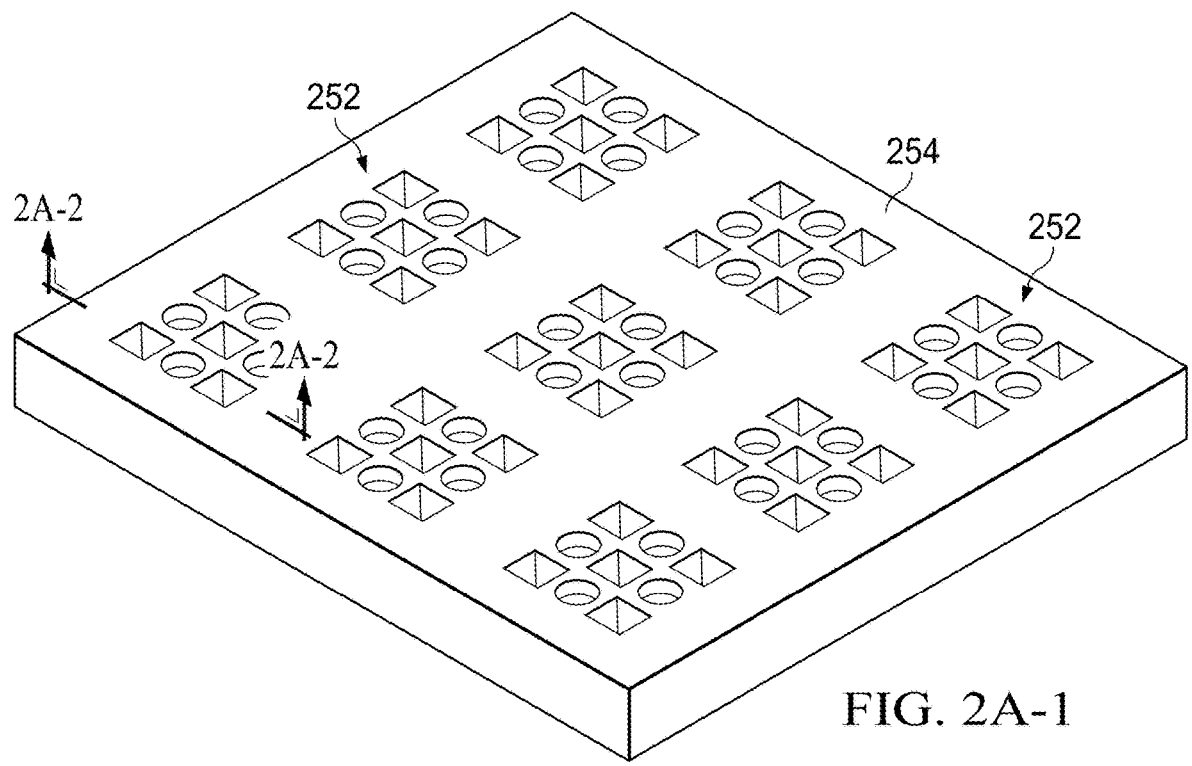
FIGS. 2A-1 to 2G-2 show fabrication of the array of SMP composite stamps employed in the transfer printing process of FIGS. 1A-1H.
Figures 2, 2A:
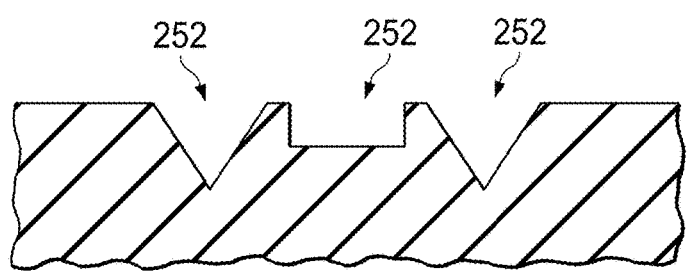
Figures 1, 2B:
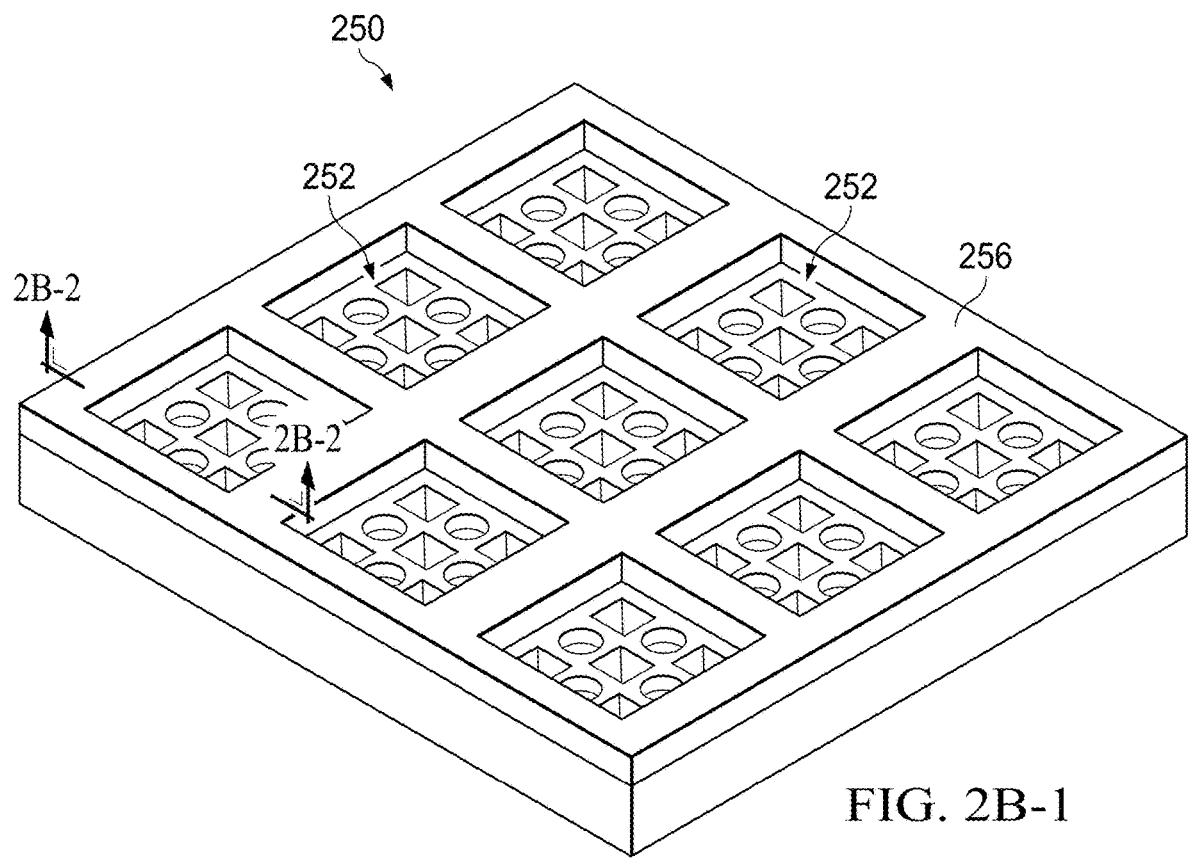
Figures 2, 2B:
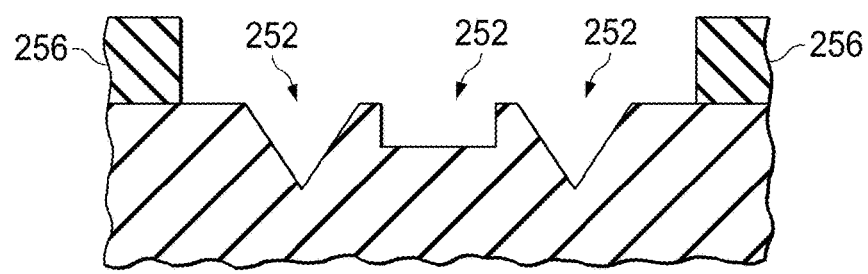
Figures 1, 2C:
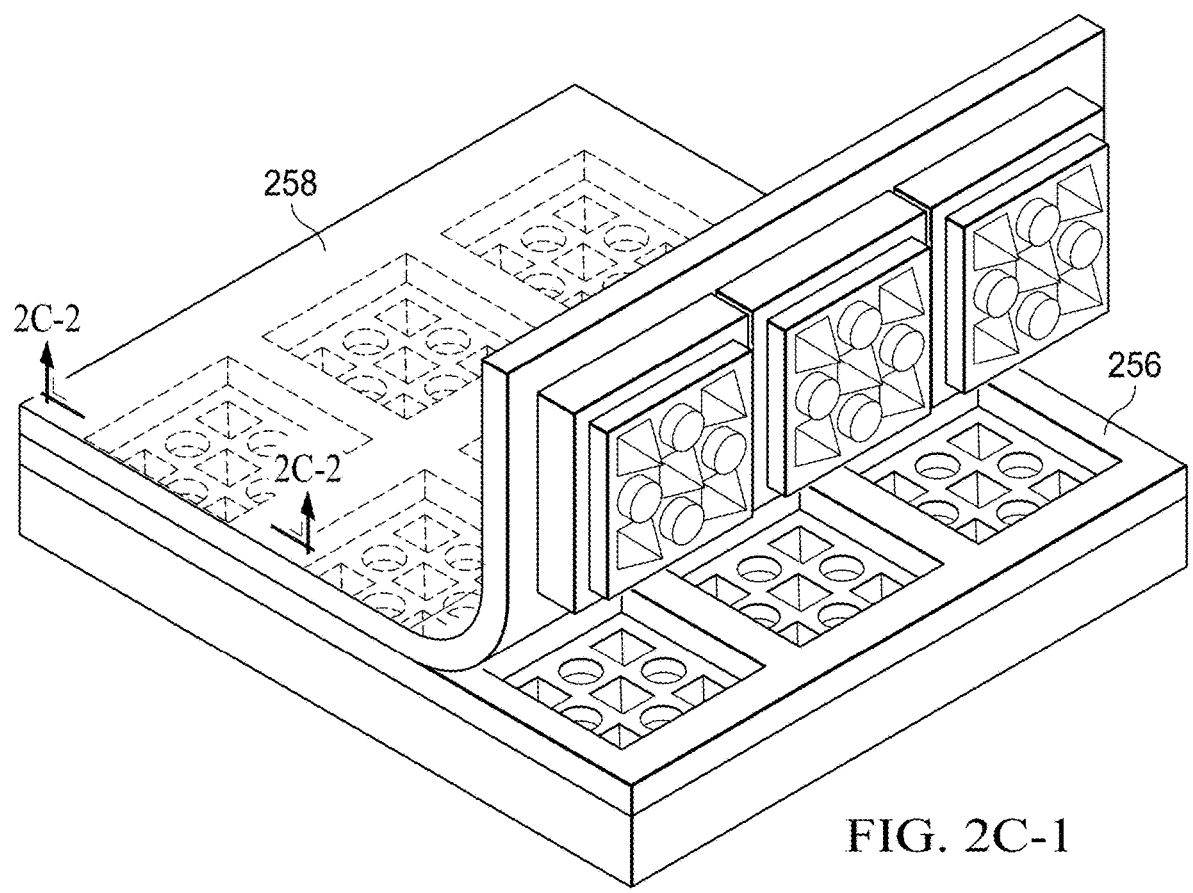
Figures 2, 2C:
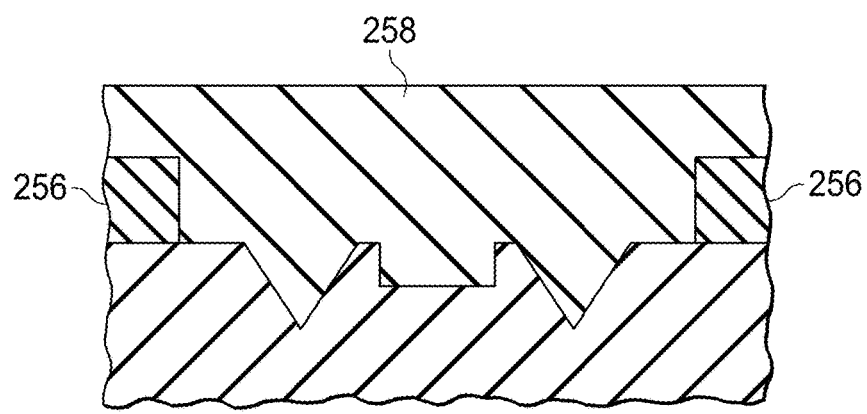
Figures 1, 2D:
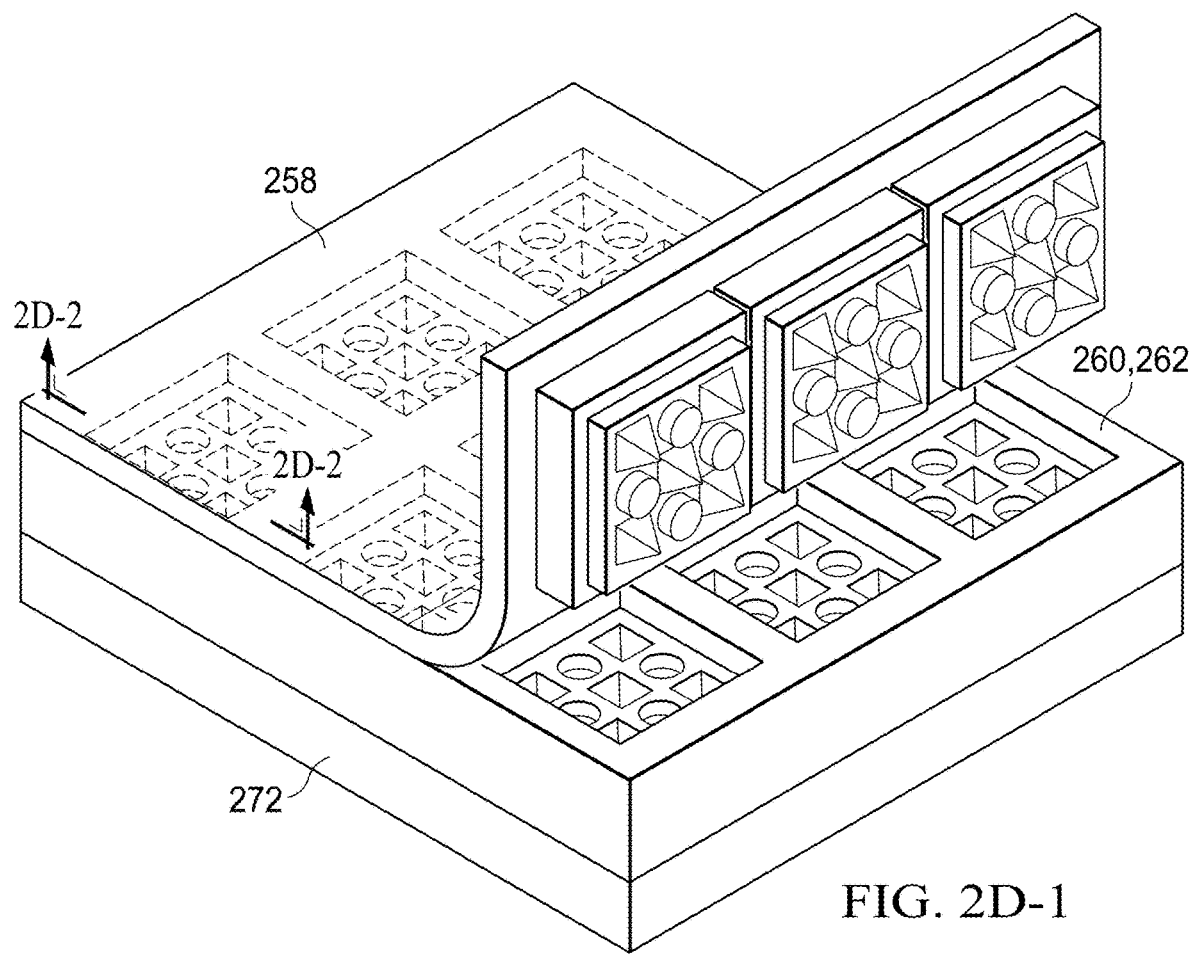
Figures 2, 2D:
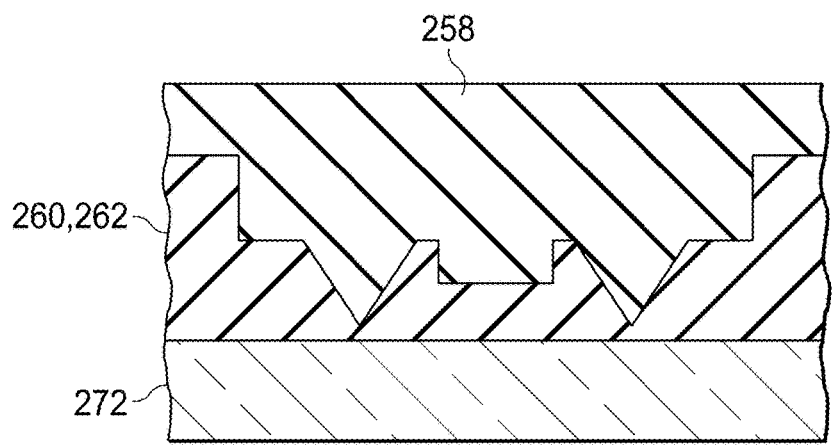
Figures 1, 2E:
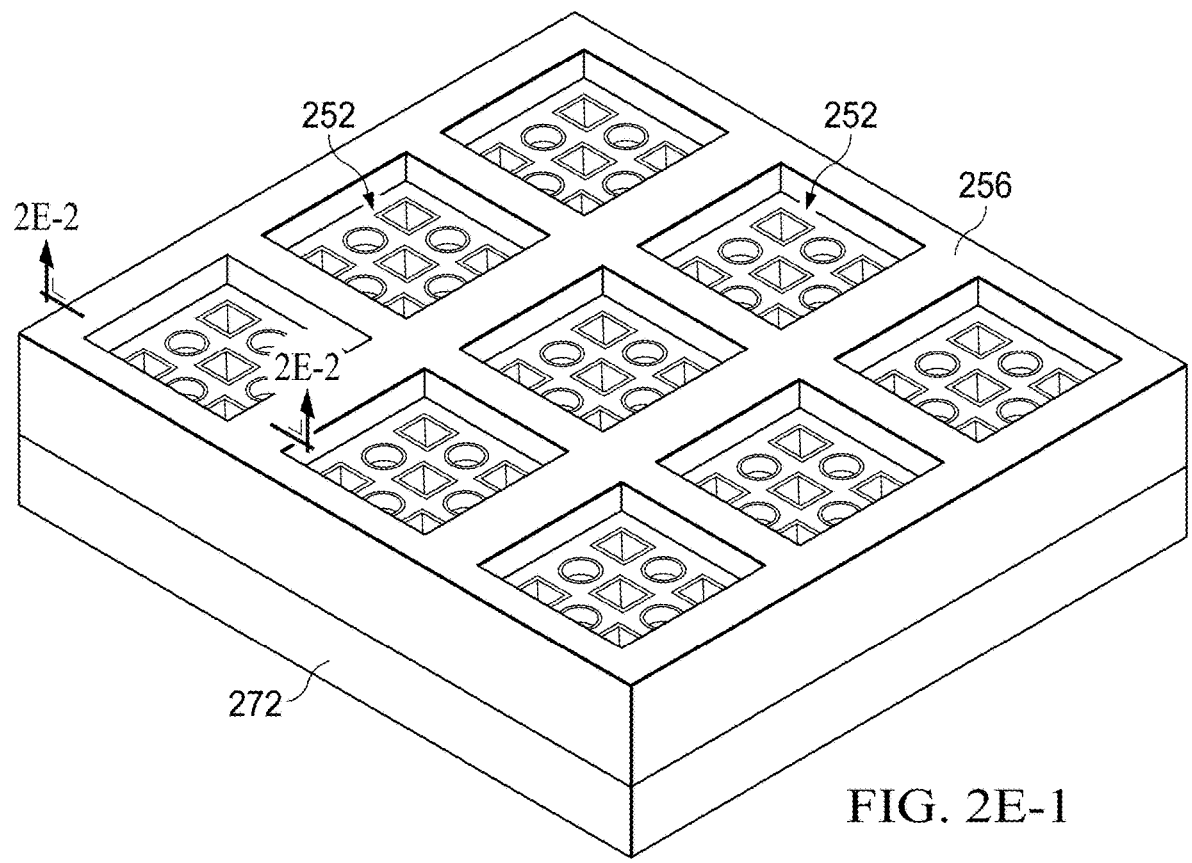
Figures 2, 2E:
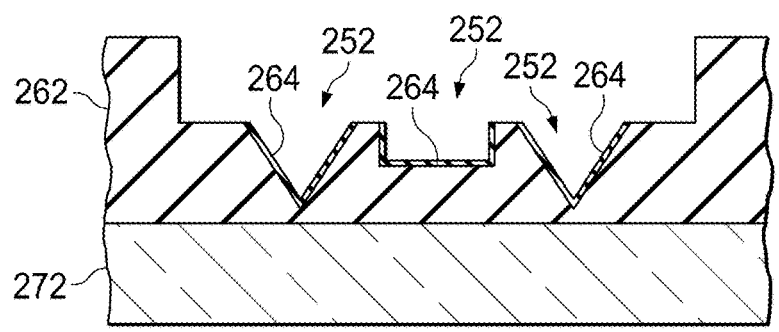
Figures 1, 2F:
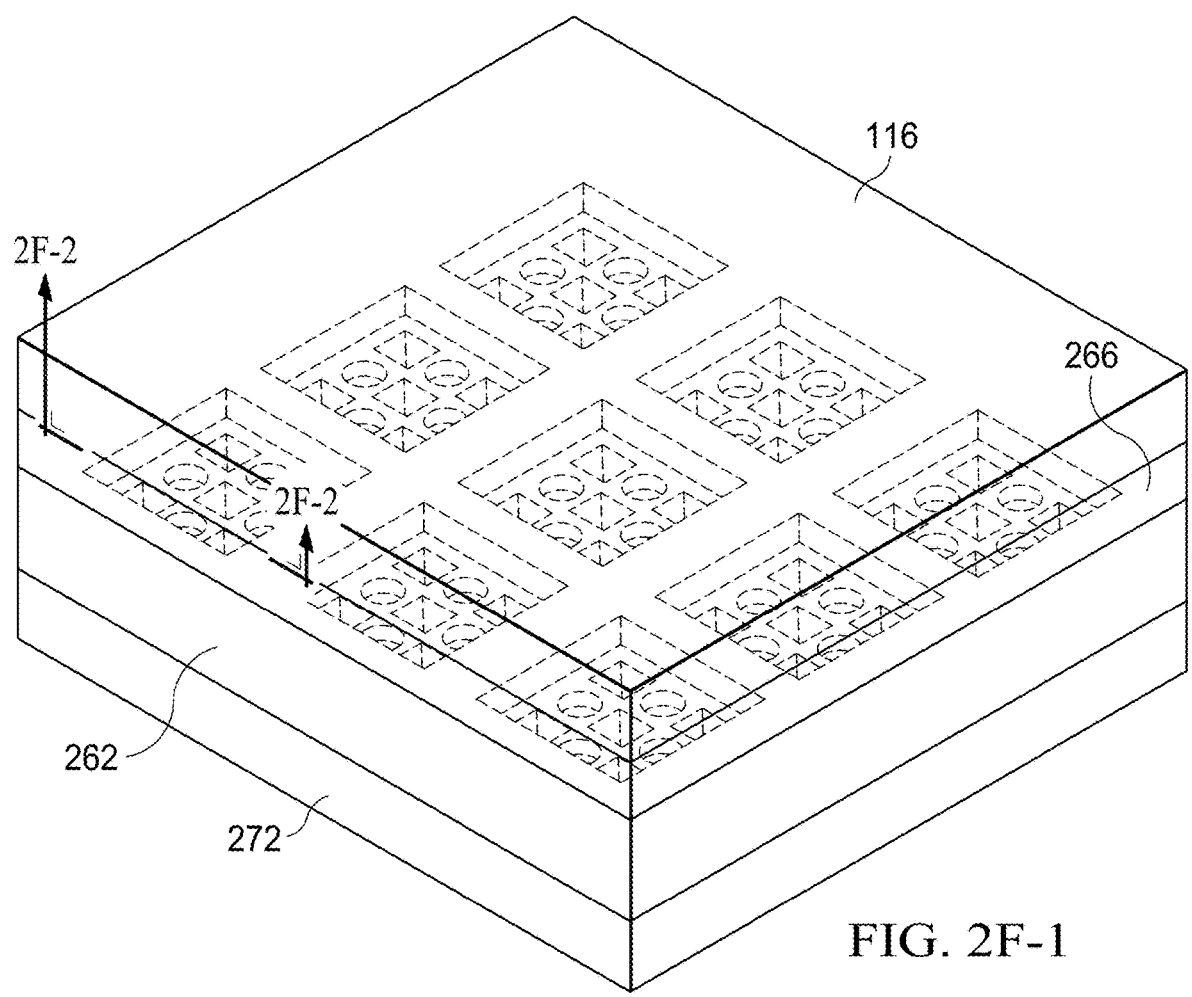
Figures 2, 2F:
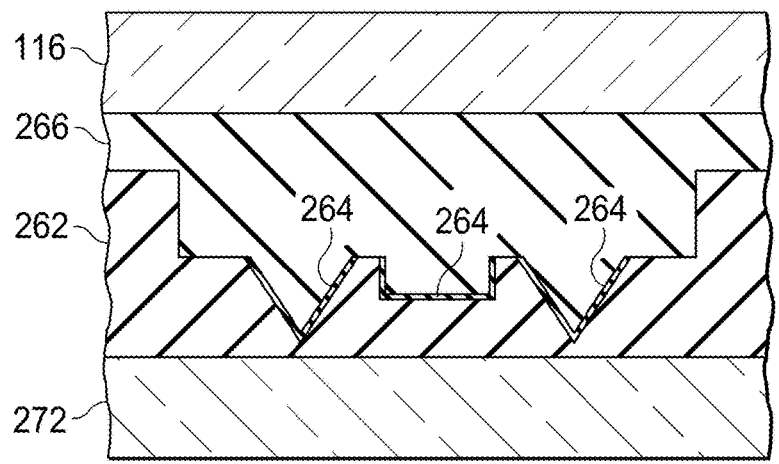
Figures 1, 2G:
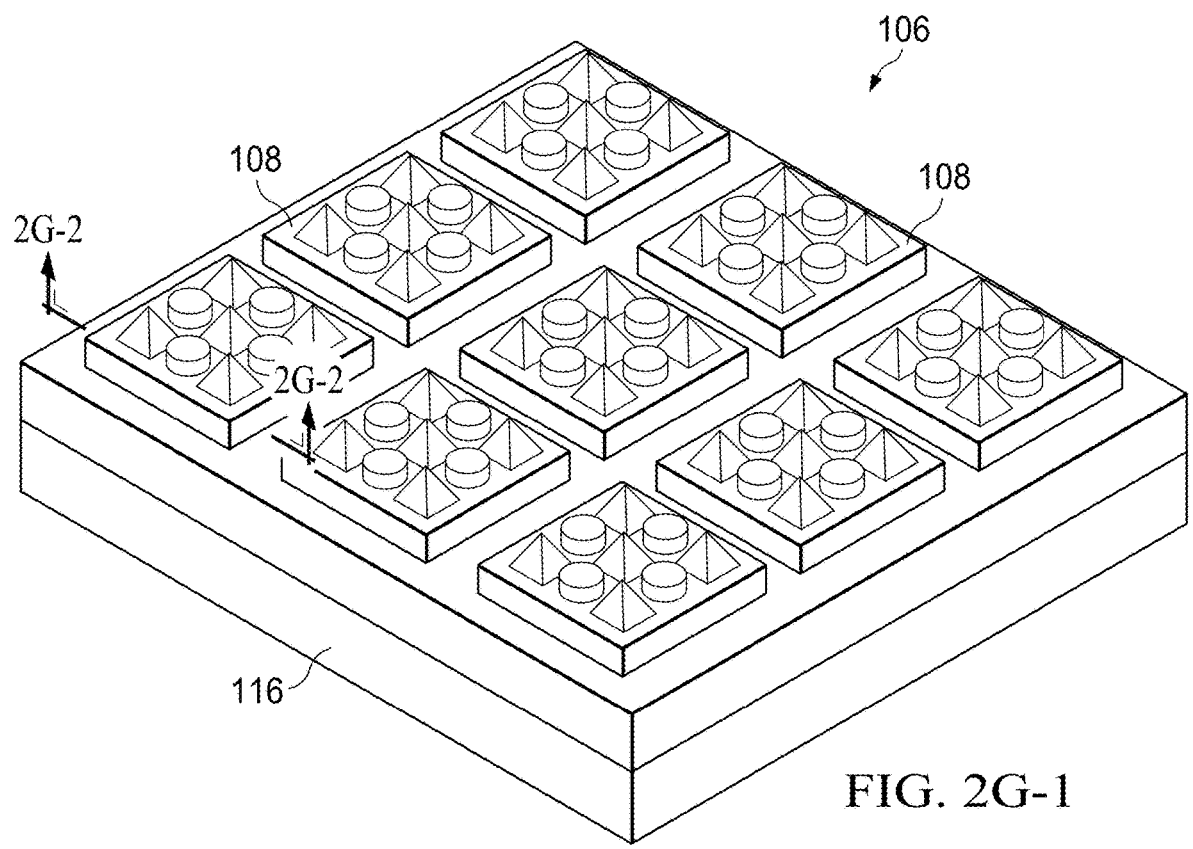
Figures 2, 2G:
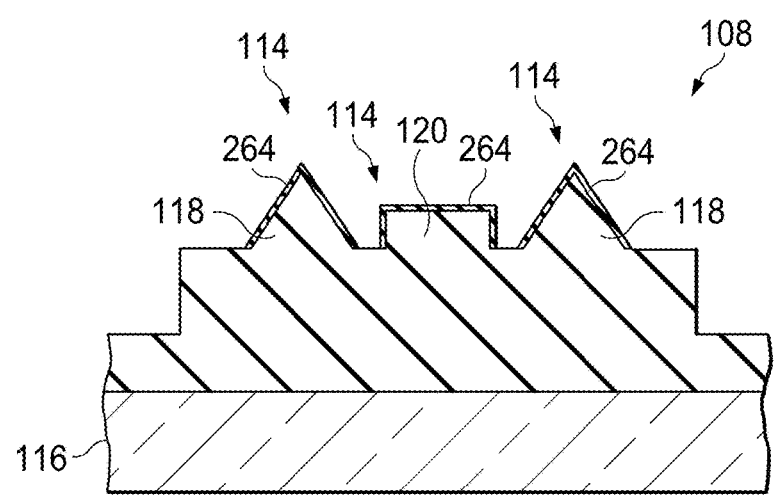
Figure 3A:
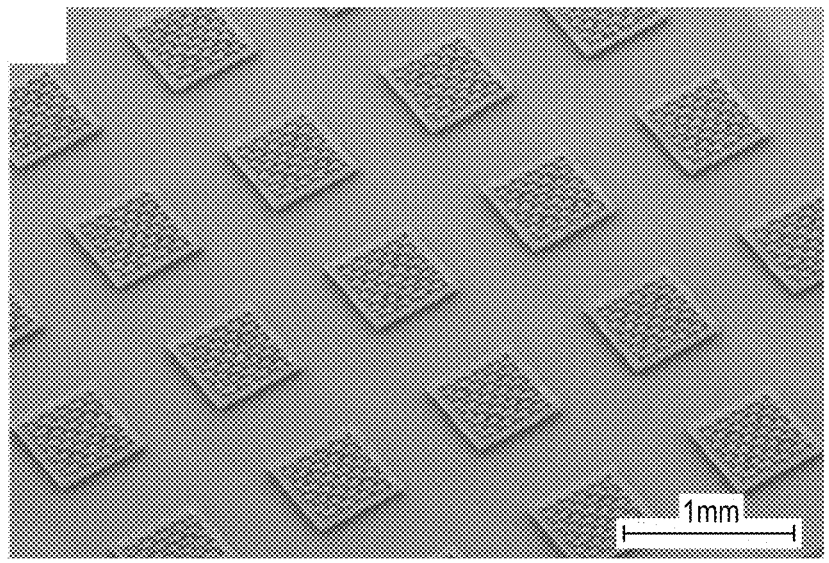
FIG. 3A shows a scanning electron microscope (SEM) image of an array of composite carbon black-shape memory polymer (CBSMP) stamps.
Figure 3B:
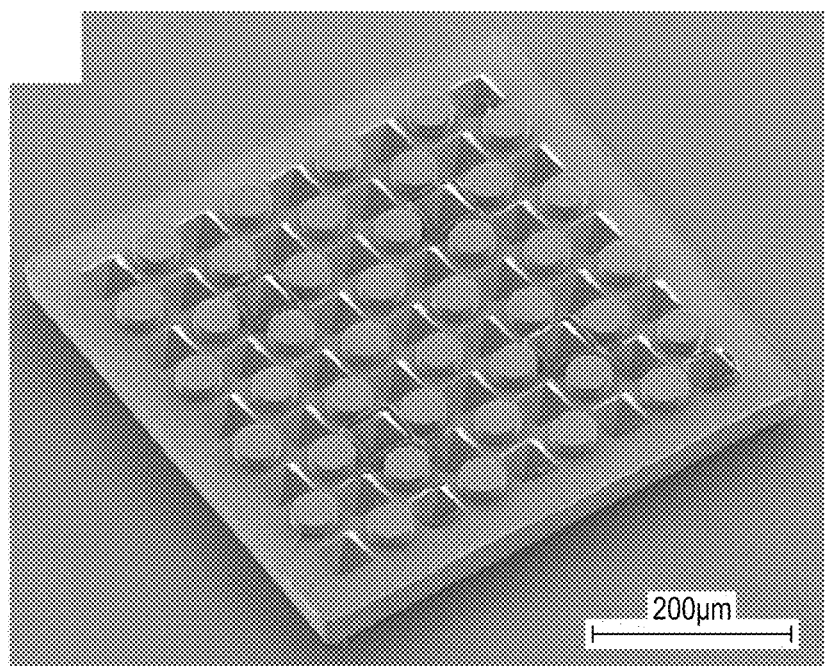
FIG. 3B shows a SEM image of a stamp from the array of FIG. 3A at a higher magnification.
Figure 3C:
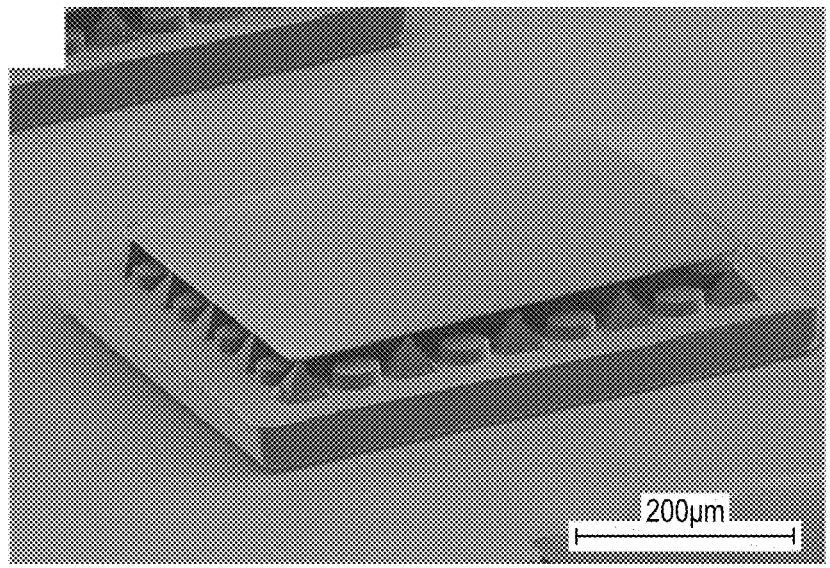
FIG. 3C shows a SEM image a 3 µm-thick silicon ink on a stamp after thermally-induced SMP shape reconstitution.
Figure 3D:
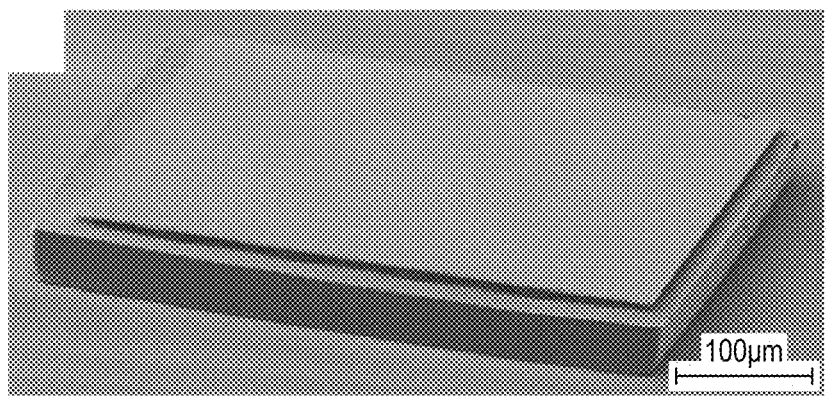
FIG. 3D shows a SEM image of a stamp in its adhesion-on configuration with an ink attached.
Figure 3E:
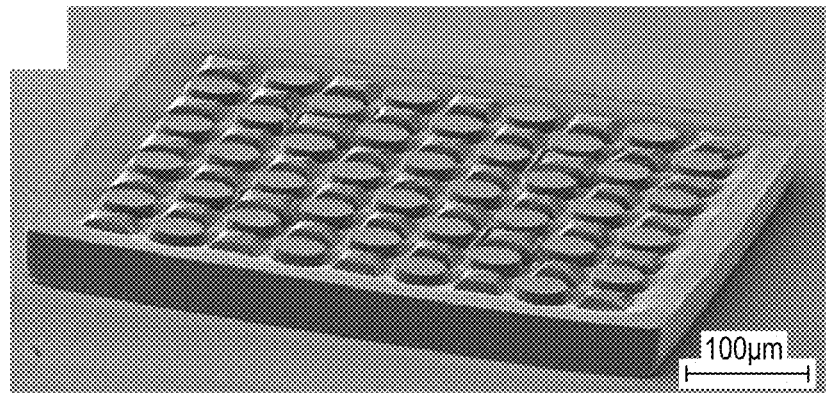
FIG. 3E shows a SEM image of the same stamp with the ink removed; side views are shown in FIGS. 3F and 3G, respectively.
Figure 3F:
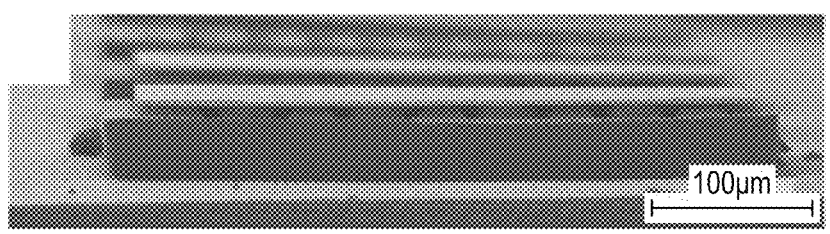
Figure 3G:
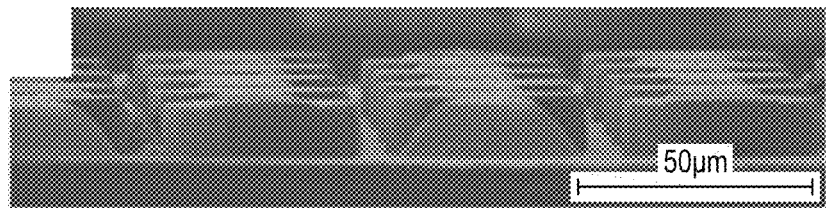

Referring first to FIGS. 2A-1 and 2A-2, indentations or pits 252 designed to form the raised surface features (e.g., drums and microtips) are etched in silicon 254, and stamp edges are defined by patterned SU-8 photoresist 256 to complete the negative silicon/SU-8 mold 250, as shown in FIGS. 2B-1 and 2B-2. Two PDMS castings 258,260 produce a negative PDMS mold 262 on a glass substrate 272, as shown in FIGS. 2C-1, 2C-2, 2D-1 and 2D-2. Indentations in the mold 262 are then selectively filled with carbon black particles 264, as illustrated in FIGS. 2E-1 and 2E-2. A SMP precursor 266 is poured into the mold 262 and covered with glass 116 (FIGS. 2F-1 and 2F-2), followed by curing and removal to form the final stamp array 106 comprising a shape memory polymer (FIGS. 2G-1 and 2G-2).

Each stamp 108 includes raised surface features 114, including pyramid-shaped microtips 118, which have been demonstrated to be a simple but highly effective means of reducing the stamp-to-ink adhesion during printing when the stamp is in its undeformed adhesion-off configuration. The exemplary design alternates the pyramidal microtips 118 with raised cylinders or drums 120, which provide a flat adhesive surface to firmly bond to the ink when the stamp 108 is in its deformed adhesion-on state. These raised surface features 114 provide a simple means to deposit NIR-absorbing carbon black 264 within the discrete regions of the stamp 108 which require heating, while maintaining optical transparency through the rest of the stamp 108 to aid observation of the printing process. The microtips 118 are sized to allow delamination from the ink surface upon heating, while the drums 120 are sized to balance visibility between the opaque surface features 114 with adhesive area.

The full selective-print cycle is shown in FIGS. 1A-1H for a 3×3 ink array, as described above. In summary, a stamp array is positioned above an ink array (FIG. 1A). The stamp array is simultaneously heated via an attached resistive heat source and each microstructured stamp is deformed to its adhesion-on state by pressing it against the inks (FIG. 1B). The stamps are then cooled to fix their shapes, and retrieval is achieved (FIG. 1C-1). After positioning the inks above the receiving substrate (FIG. 1D), a brief laser pulse is directed locally to a selected stamp directly attached to an individual ink (FIG. 1E). The laser illumination is absorbed by the CBSMP, heating it and adjacent SMP to initiate shape reconstitution to its original adhesion-off configuration. This step is repeated for each ink to be printed (FIG. 1F-1) and then the stamps are brought into contact with the receiving substrate (FIG. 1G) before retracting to leave the desired ink pattern (FIG. 1H). The close-up schematics of FIGS. 1C-2 and 1F-2 highlight two stamps in adhesion-on and adhesion-off configurations, respectively, with different ink-stamp interfacial contact areas.

Scanning electron microscope (SEM) images of a representative CBSMP stamp array are shown in FIGS. 3A-3G. A stamp is shown in its adhesion-on state in FIGS. 3D-3G, including images with a 3 µm-thick, 500 µm square silicon ink attached, corresponding to the step shown in FIG. 1C, and with the silicon ink removed to show the fixed, deformed shape of the stamps. A stamp is also shown with a silicon ink attached to the stamp in its ready-to-print configuration in FIG. 3C, corresponding to the step in FIG. 1F.

EXAMPLES

Example 1

Transfer Printing Machine

Figure 4A:
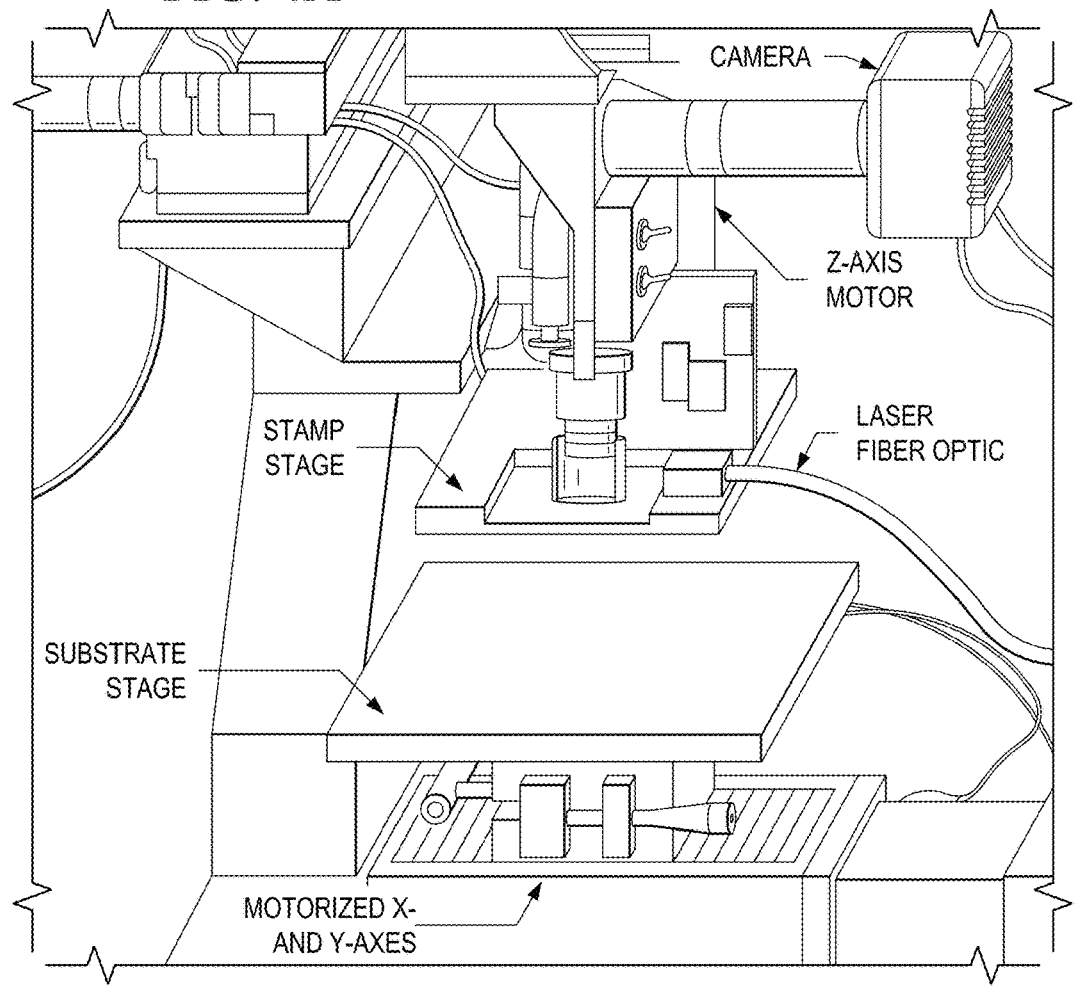
FIG. 4A is a schematic of an automated micro-transfer printer used for performance and demonstration of the CBSMP laser-driven printing system.
Figure 4B:
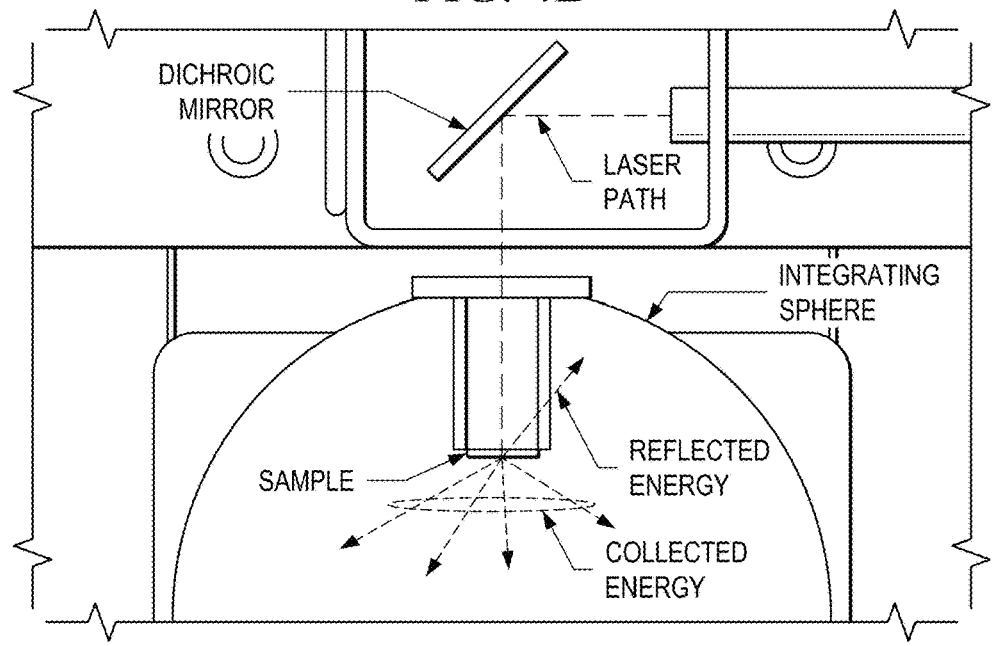
FIG. 4B is a schematic of laser absorption measurements made using an integrating sphere power sensor. The laser power transmitted through a baseline glass sample is compared with that for SMP and CBSMP stamps having raised surface features, including SMP microtips (FIG. 4C), SMP microtips with drums (FIG. 4D), CBSMP microtips (FIG. 4E), and CBSMP microtips with drums (FIG. 4F), where the images share a common scale.

The transfer printing machine used for this work is depicted in FIG. 4A, and includes an integrated laser source. Power delivery to the CBSMP during an incident laser pulse is a function of the laser's intensity and the absorbance of the CBSMP material. Measuring the proportion of incident laser power absorbed by the CBSMP structures is therefore essential to properly predict the response of the stamps under laser illumination. This measurement is performed using a photodiode power meter (Thorlabs S142C). Arrays of stamps including raised surface features (microtips and drums) are fabricated out of a SMP with and without the added CB. In both cases, the raised surface features are formed in the surface of a thin (50 to 100 µm) SMP layer. Much of the light passing through the raised surface features of the stamps is refracted in various directions, particularly in the case of the microtips where nearly all incident light is refracted away from the original beam path. To measure the proportion absorbed, this refracted light can be collected. This is accomplished by lowering the SMP samples slightly into the integrating sphere detector as depicted in FIG. 4B, such that the great majority of refracted light remains within the sphere.

Figure 4C:
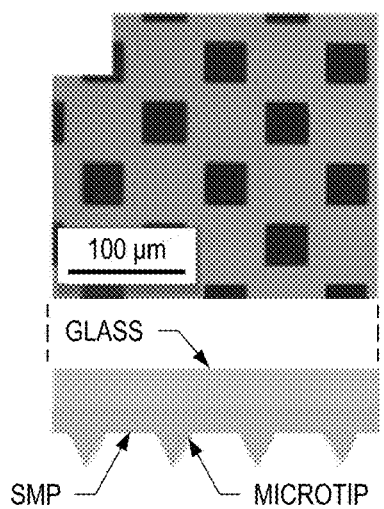
Figure 4D:
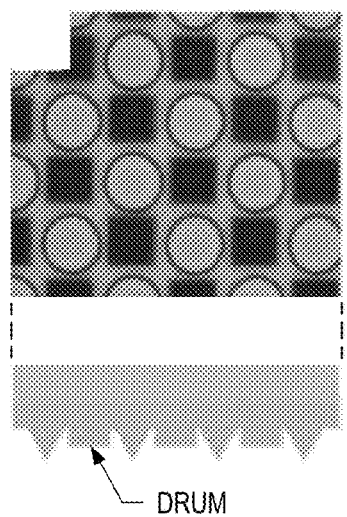
Figure 4E:
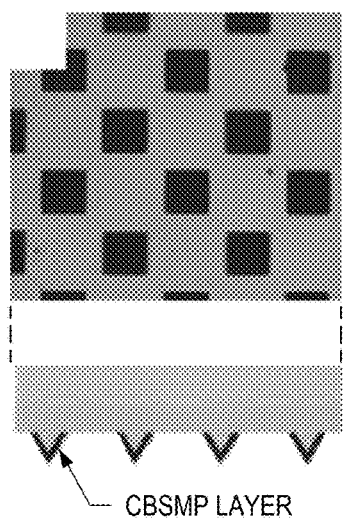
Figure 4F:
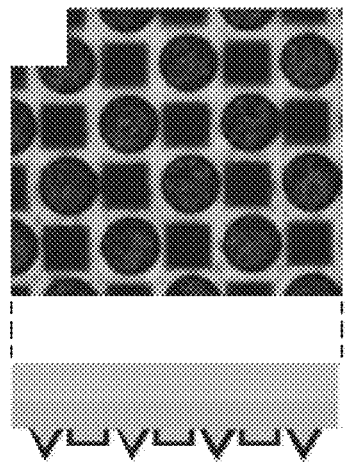

Six separate sample configurations are prepared, each being tested at three distinct locations to ensure repeatability. The stamps take the form of a thin layer mounted on a 1 mm-thick piece of plain microscope glass. Therefore, the attenuation of the other samples is measured against the power transmitted through a similar piece of glass. The power attenuated by a featureless, thin layer of SMP is additionally tested and is found to be approximately 1%. The other four samples consist of: plain SMP with microtips only (FIG. 4C), plain SMP with microtips and drums (FIG. 4D), CBSMP with microtips only (FIG. 4E), and CBSMP with microtips and drums (FIG. 4F). The projection area of the microtips and drums in the beam path are calculated to be 25% and 33% of the total area, respectively. Attenuation for each sample relative to the glass-only baseline sample is calculated by comparing the detectable power transmitted through each sample from an incident beam of constant intensity. Results are shown in Table 1. The small degree of attenuation with the plain SMP samples indicates nearly all of the light incident on the raised surface features passes through with little absorption. The minor attenuation measured is likely due in small part to absorption within the SMP, and in larger part to internal reflections and refractions within the microtips which direct some energy back out of the detector. For CBSMP samples, the attenuation increases to be approximately equal to the projection area of the traised surface features. The minor discrepancy is likely attributable to the scattered presence of CB particles between raised surface features, since energy entering the microstructures is anticipated to be absorbed leaving little to be reflected upwards. The conclusion from these experiments is that essentially all of the NIR illumination incident on the raised surface features is absorbed by the embedded CB particles, thus providing the heat necessary for the SMP's function.

also to assure that heat is distributed adequately to effect the necessary shape reconstitution throughout the stamp while avoiding hot spots which could lead to thermal degradation. During fabrication, CB particles are concentrated near to the PDMS mold surface as the SMP precursor is poured in. Though some degree of mixing with the precursor occurs, the distribution of CB is preferably not uniform throughout the stamp and is instead more heavily concentrated near to the surface. To represent the CB distribution, a 2 μm absorption layer is incorporated in the FEM.

Heat generation rates within the CBSMP layer are calculated based on the data shown in Table 1 indicating that virtually 100% of the incident laser energy is absorbed while passing through the raised surface features. The thermal properties of the particular SMP in use have not been thoroughly investigated, although it is reasonable to expect close agreement with other similarly structured epoxy-based polymers. Polycarbonate is found to be a well-defined material which very closely matches the thermal properties for similar epoxy polymers, and is therefore used to represent the SMP in the Comsol models.

Figure 5A:
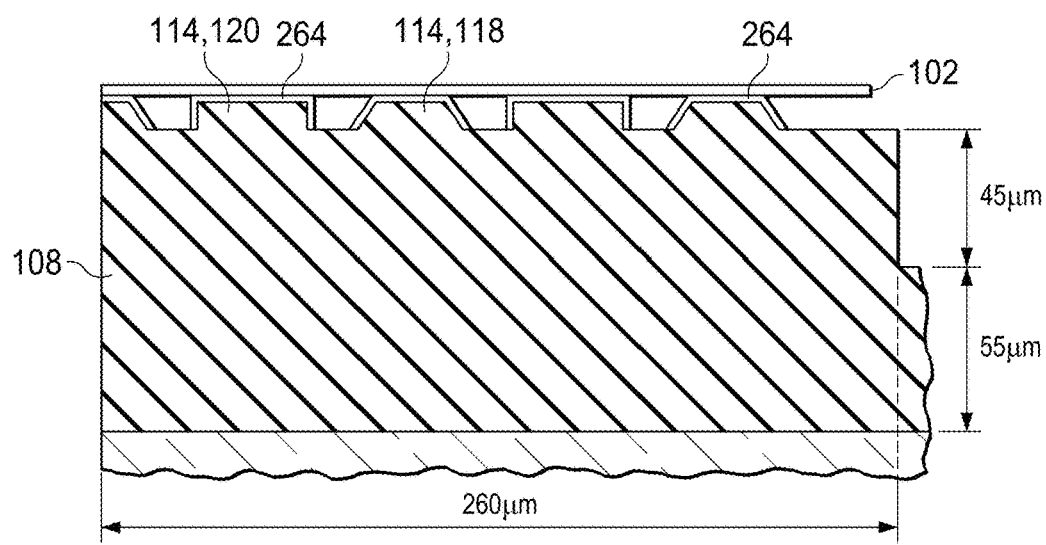
FIG. 5A shows a symmetry-based 3D finite element model where laser absorption occurs within a thin 2 µm CBSMP layer.
Figure 5B:
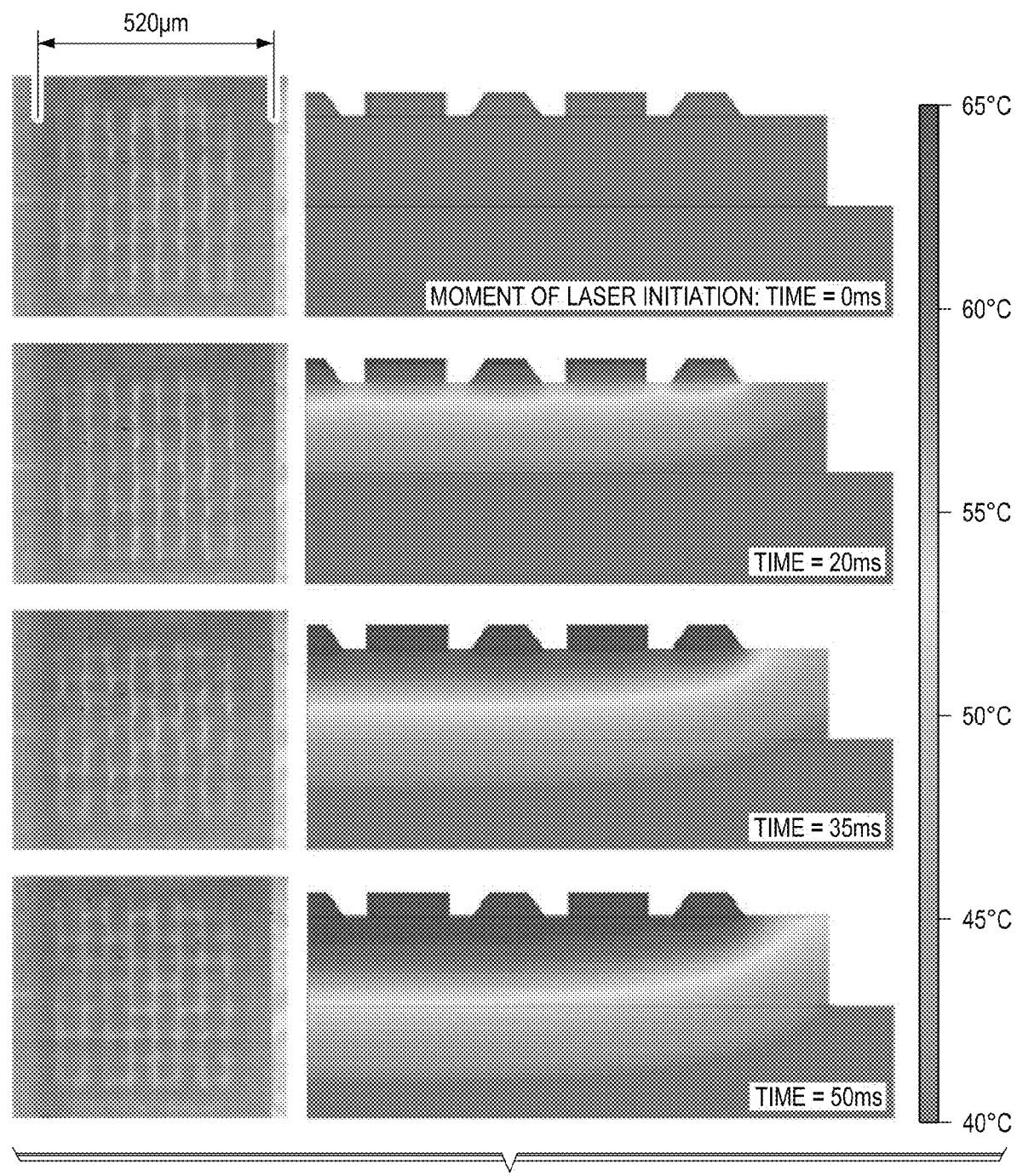
FIG. 5B shows high-speed footage of the CBSMP stamp during continuous laser illumination compared with the corresponding FEA temperature profile for times counting from the moment of laser initiation.

High speed images of a CBSMP stamp undergoing laser-driven shape reconstitution to release a 3 μm thick silicon ink are compared with the FEM results in FIG. 5B. The results are obtained using a beam power of 93 mW, corresponding to an intensity of 330 mW mm$^{-2}$ for the 600 μm diameter beam. Times listed in FIGS. 5B and 5C count up from the initiation of the NIR laser illumination. The high speed images are taken looking down through the stamp during the event using a Phantom v7.3 camera, and show within the stamp edges a 9×9 grid of deformed drums and microtips which appear as dark spots, reconstituting their shape as their temperature increases. The reconstitution is visible as a subtle change in the surface features' appearance from somewhat blurred together in their initial, compressed state, to fully distinct features at 50 ms.

Corresponding FEM results are collected using the full model (as shown in a partial side view in FIG. 5A), but only the temperatures for the SMP material are shown for clarity. Heat generation within the Si ink is calculated based on

TABLE 1

Results of absorption testing, showing the effectiveness of the CB for absorbing NIR laser energy.

| Sample Type | Transmitted Power [mW] | total % attenuation | microtip area | drum area | total structure area | % attenuation attributed to CB in microstructures |
|---|---|---|---|---|---|---|
| Glass slide | 208 | — | — | — | — | — |
| Flat SMP | 206 | 1% | — | — | — | — |
| Microtips only | 202 | 3% | 25% | — | 25% | — |
| Microtips & drums | 202 | 3% | 25% | 33% | 58% | — |
| CB Microtips only | 149 | 28% | 25% | — | 25% | 25% |
| CB Microtips & drums | 80 | 61% | 25% | 33% | 58% | 58% |

Example 2

Thermal Behavior of SMP during and following Laser Illumination

A symmetry-based thermal finite element model (FEM) developed using Comsol Multiphysics is employed to understand the thermal behavior within the SMP composite during and following laser illumination. It is of particular interest to know the power required to adequately heat the deformed SMP stamp and the speed at which this heating occurs, and previously published absorption data, collected with the same laser printing system used in the present work, showing a silicon ink of 3 μm thickness experiences a power density of 5e11 W m$^{-3}$ for a laser input power of 3.268 W. From this, a linear relationship is derived in which power absorption within the silicon ink is 1.53e11 W m$^{-3}$ per 1 W of incident laser power. The energy first absorbed by the CBSMP features is accounted for when calculating incident laser power on the ink. The color bar corresponds to the glass transition of the SMP to illustrate the regions of the SMP stamp which are hot enough to undergo shape reconstitution. Note that the initial temperature of the system is 27° C., which is below the range of this temperature scale. A temperature below 40° C. indicates an SMP region which remains fixed in its deformed configuration, whereas the shape recovery becomes increasingly rapid and thorough as the temperature is increased through 65° C.

Figure 5C:
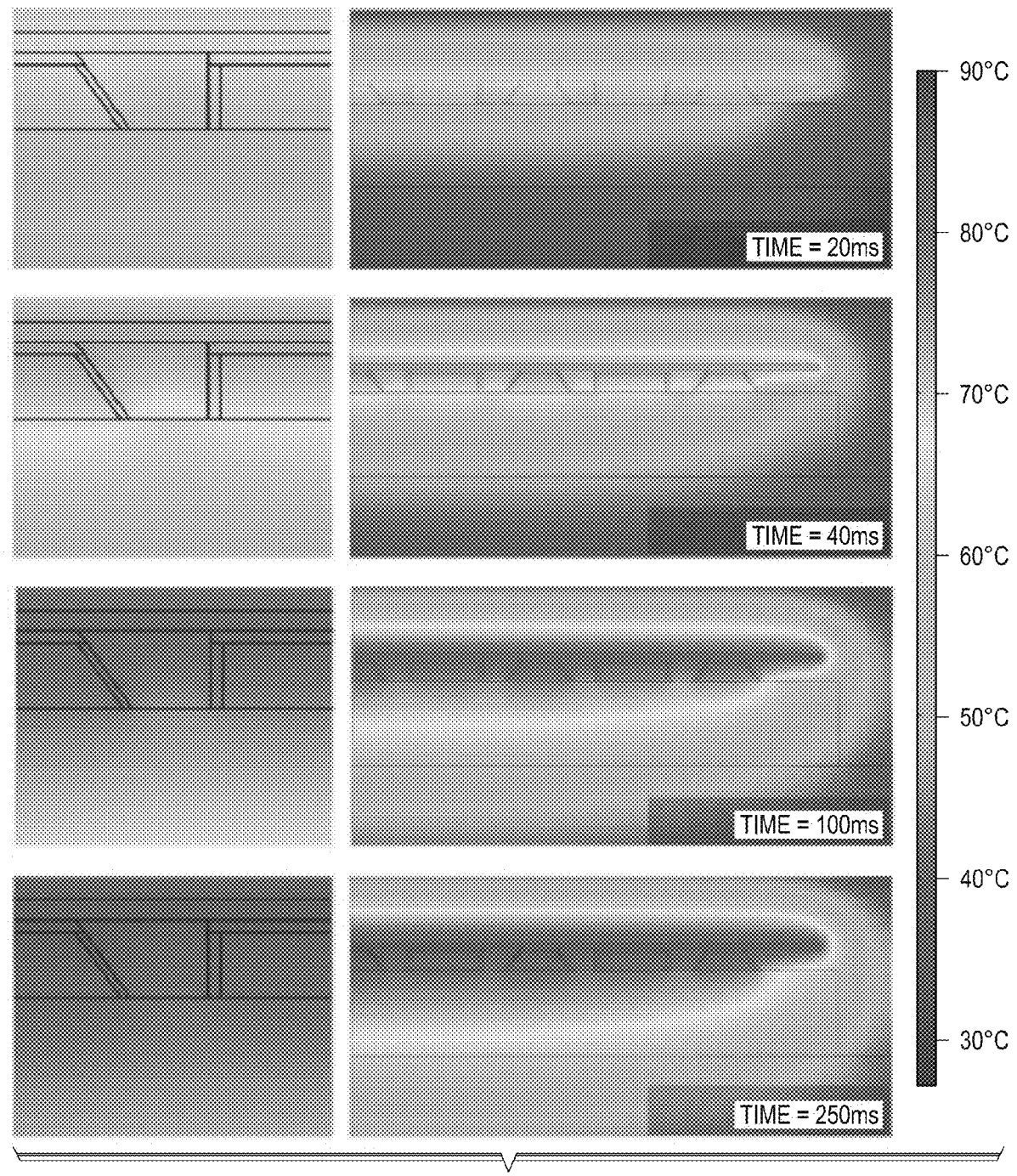
FIG. 5C shows a predicted temperature profile in the stamp/ink system during a print, including detail of the central raised surface features.

FEM results are provided for the same test configuration but with a full temperature scale and for a longer pulse duration in FIG. 5C. Thermogravimetric analysis of the SMP is provided in FIG. 6B. The data indicate that the material begins to suffer significant mass loss, indicating material decomposition, once heated above approximately 275° C. It is therefore desirable to keep the local temperature well below this limit during operation. Examination of the thermal gradients within the model depicted in FIG. 5C indicates adequate heat diffusion within the stamp to prevent excessive temperature for the power levels under consideration. Stronger power intensity can potentially improve printing speed as greater throughput is demanded.

Figure 6A:
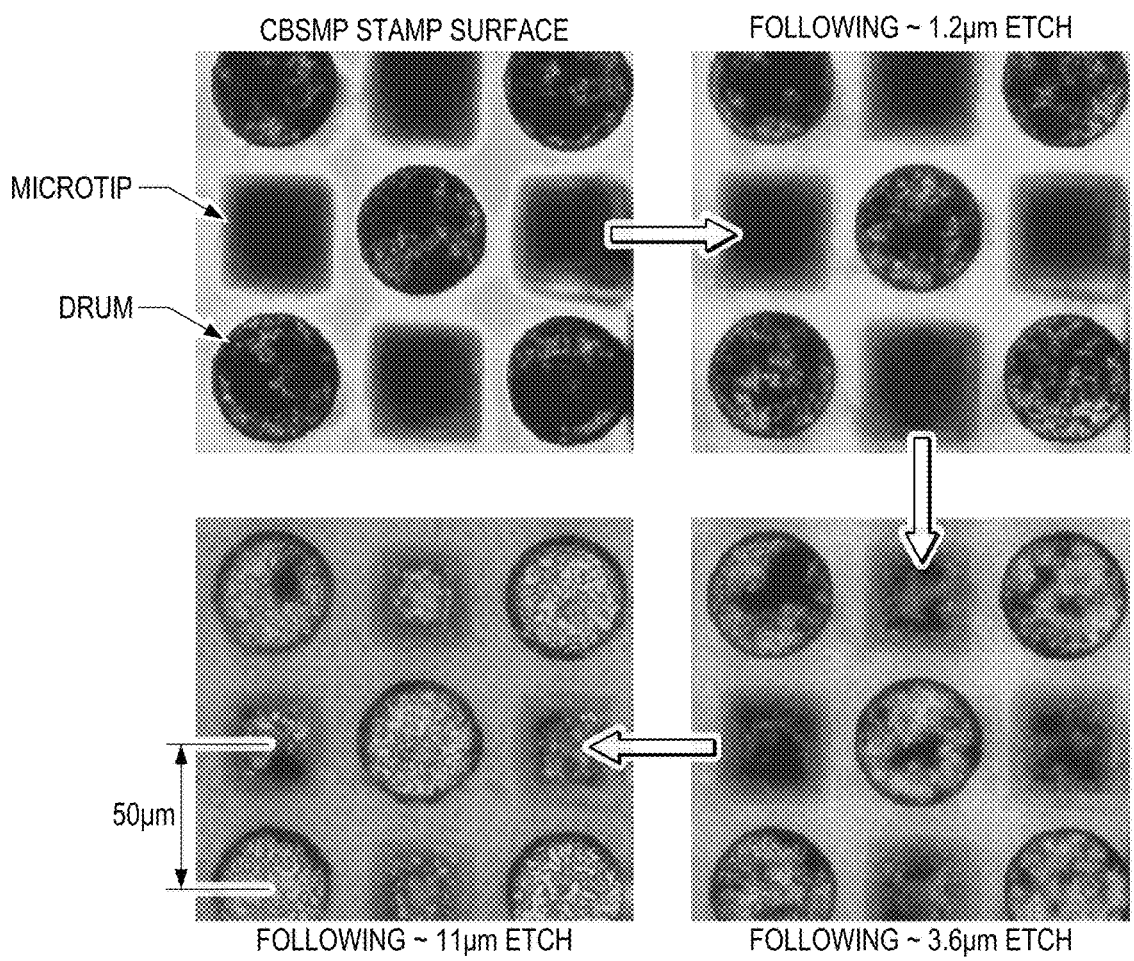
FIG. 6A shows optical transmission images indicating the surface concentration of carbon black within the shape memory polymer as surface material is etched away in stages. Extended etching produces noticeable surface roughness.
Figure 6B:
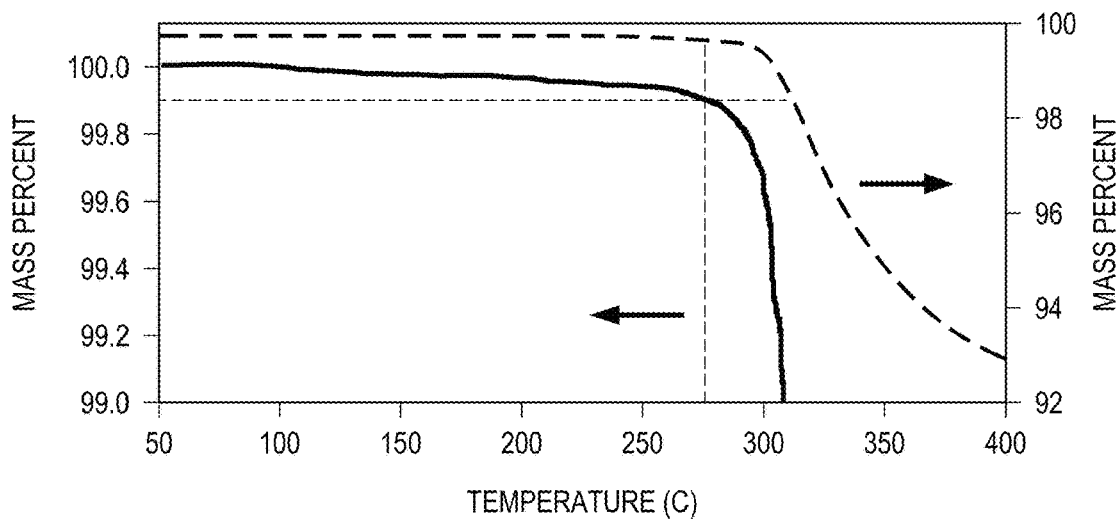
FIG. 6B shows data from thermogravimetric analysis of the SMP material from 50° C. to 400° C. using a 10° C. min$^{-1}$ heating rate. The full data set is shown as a dashdotted line. The same data are shown with an expanded y-axis for greater detail as a solid black line, indicating the "degradation temperature" where the mass drops below 99.9% of its original value.

The nature of CB particle distribution is investigated by using an oxygen plasma to etch away the surface of a stamp in stages, revealing the changes in light transmission as material is removed. Representative images are shown in FIG. 6A, where light transmission through the drums is shown to increase as embedded CB particles are removed along with SMP matrix. As expected, the CB concentration is greatest close to the surface and gradually tapers for several microns into the stamp. To represent this CB distribution appropriately with regard to simulation of surface hot-spots, a 2 µm absorption layer is incorporated in the FEM, as described above.

Figure 7:
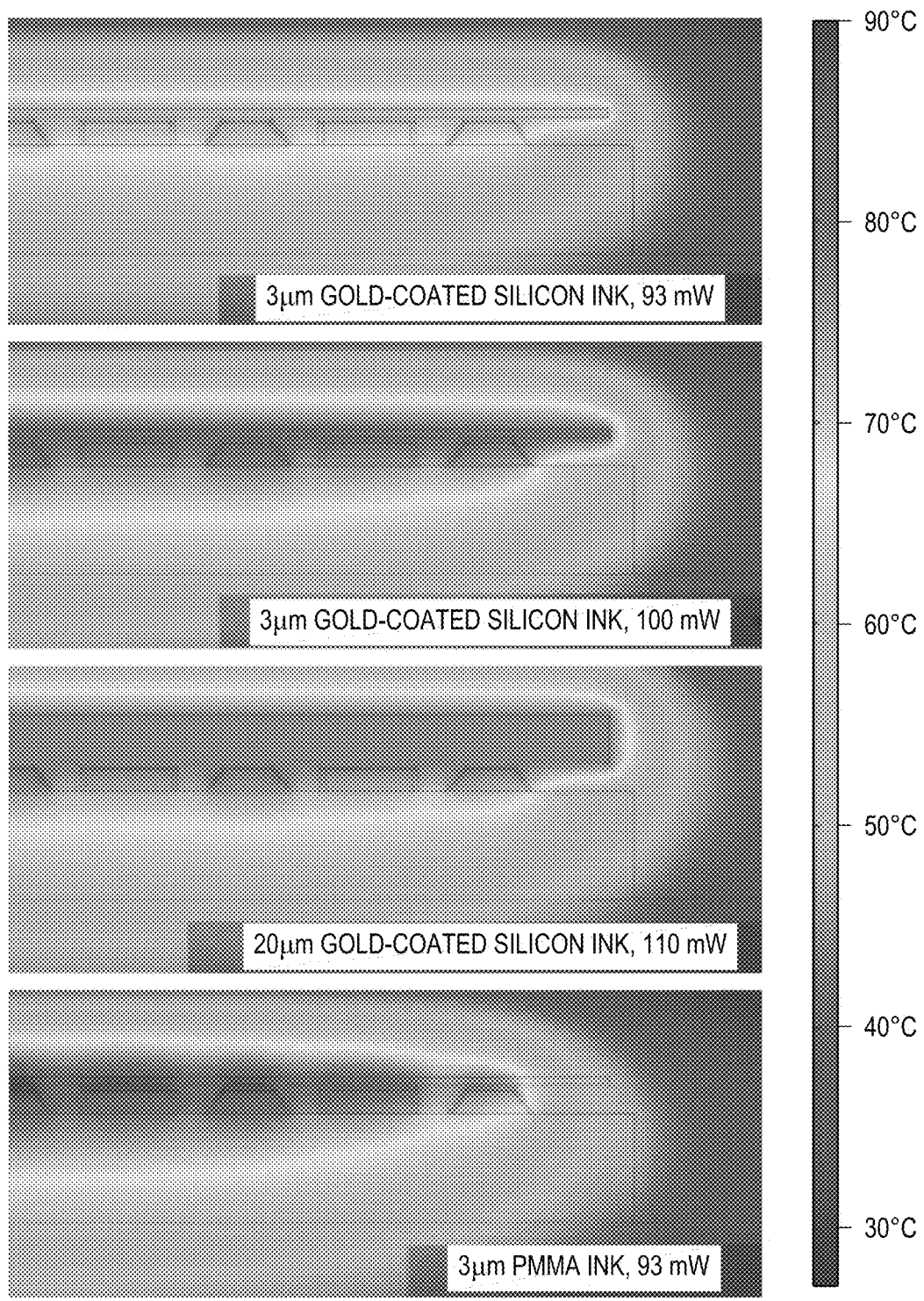
FIG. 7 shows simulated results at 100 ms into the transient event for a thermally conductive non-absorbing ink (top), the same ink with increased power (second from top), a thicker thermally conductive non-absorbing ink (second from bottom), and a non-conductive and non-absorbing ink (bottom).

Many factors affect the thermal behavior during a print cycle, and the thermal effects of changing ink material and geometry are of interest. Gold is frequently utilized in functional MEMS devices as an electrical contact surface or interfacial bond-facilitating layer, among other uses. Even thin layers of gold are highly reflective to NIR radiation, preventing their use in printing approaches that rely on NIR absorption within the ink material. The effect of a perfectly reflective thin gold coating is simulated and shown in FIG. 7 (top image), 100 ms into the laser illumination. Due to the reduced energy absorbed in the system, overall temperature decreases when compared to a similar simulation with the absorbing silicon ink. This can be effectively compensated for by modestly increasing the power input without negatively impacting the temperature distribution (FIG. 7, second image from top). The gold-coated silicon ink represents any class of thermally conductive, non-absorbing ink used in the CBSMP system.

Increasing the thermal mass of the ink is investigated by increasing the thickness of ink from 3 µm to 20 µm (FIG. 7, second image from bottom). Temperatures experience a modest decrease, which again may be easily compensated for with an increase in power. Although silicon remains a common standard ink material, many ink materials of interest are not thermally conductive. The effect of using a non-conductive and non-absorbing ink is shown in bottom image of FIG. 7, using poly(methyl methacrylate) (PMMA) as an example material. The results demonstrate that a conductive ink is advantageous with regard to distributing heat across the surface of the stamp, although the nonconductive ink still allows for adequate heat distribution to permit printing to occur. The intensity of localized hot spots within the CBSMP microstructures increase modestly, thus modestly reducing the maximum rate of safe power delivery and resulting in a corresponding modest increase in print time for a highly-optimized process.

Example 3

Mechanical Behavior of the SMP

The mechanical behavior of the SMP changes dramatically in relation to its local temperature as it passes through its glass transition. Storage and loss moduli have been previously calculated for the SMP as functions of temperature (Xie and Rosseau, *Polymer*, 50 (2009) 1852), where it is referred to as formulation NGDE2. Subsequent analysis (Eisenhaure and Kim, *Polymers*, 6 (2014) 2274) confirmed these calculations and investigated the effects of large CB particle loading. Both results show a dramatic peak in loss modulus (indicated by tan δ) within the glass transition zone between approximately 40° C. and 65° C. Below this temperature range, the storage modulus (E') is ~3 GPa, and above it E'≈9 MPa. Reconstitution does not occur as rapidly as would be expected for an elastic material suddenly allowed to spring back from a compressed shape, but rather exhibits a short but noticeable time lag as it passes through the SMP's glass transition due to the viscous nature of the SMP, as evidenced by the characteristic sharp increase in loss modulus. Once temperatures reach the upper end of the glass transition, the viscous nature of the response is significantly reduced and reconstitution occurs with greater rapidity and completeness. Mechanical response time is therefore strongly a function of the local temperature within the SMP's deformed structures. Reconstitution times below 50 ms have been observed for a modest 93 mW beam power. For the present purposes of conceptual demonstration, this is considered sufficiently rapid, and does not result in stamp damage even during extended pulses. Increased speed may be realized with higher beam power levels that would require increased control over pulse duration to avoid overheating, which can be observed as outgassing of the SMP material during extended pulses when beam power is in excess of 200 mW.

Example 4

Demonstration of Printing Method

Printing in the general case is carried out as depicted in FIGS. 1A-1H and as described above. A set of inks is retrieved from a donor substrate by a matching array of stamps, from which a pattern is printed in parallel to a receiving substrate. For the purposes of demonstration, a 5×5 array of stamps is used to retrieve and print silicon inks with 500 µm lateral dimension and 3 µm thickness. These inks are fabricated with a center-to-center spacing of 1 mm. These dimensions are chosen for compatibility with the installed laser optics on the micro-transfer printer depicted in FIG. 4, but may be scaled up (e.g., center-to center spacing of 1 mm or greater) or down (e.g., center-to-center spacing of less than 1 mm) by adjusting the laser spot size.

Figure 8:
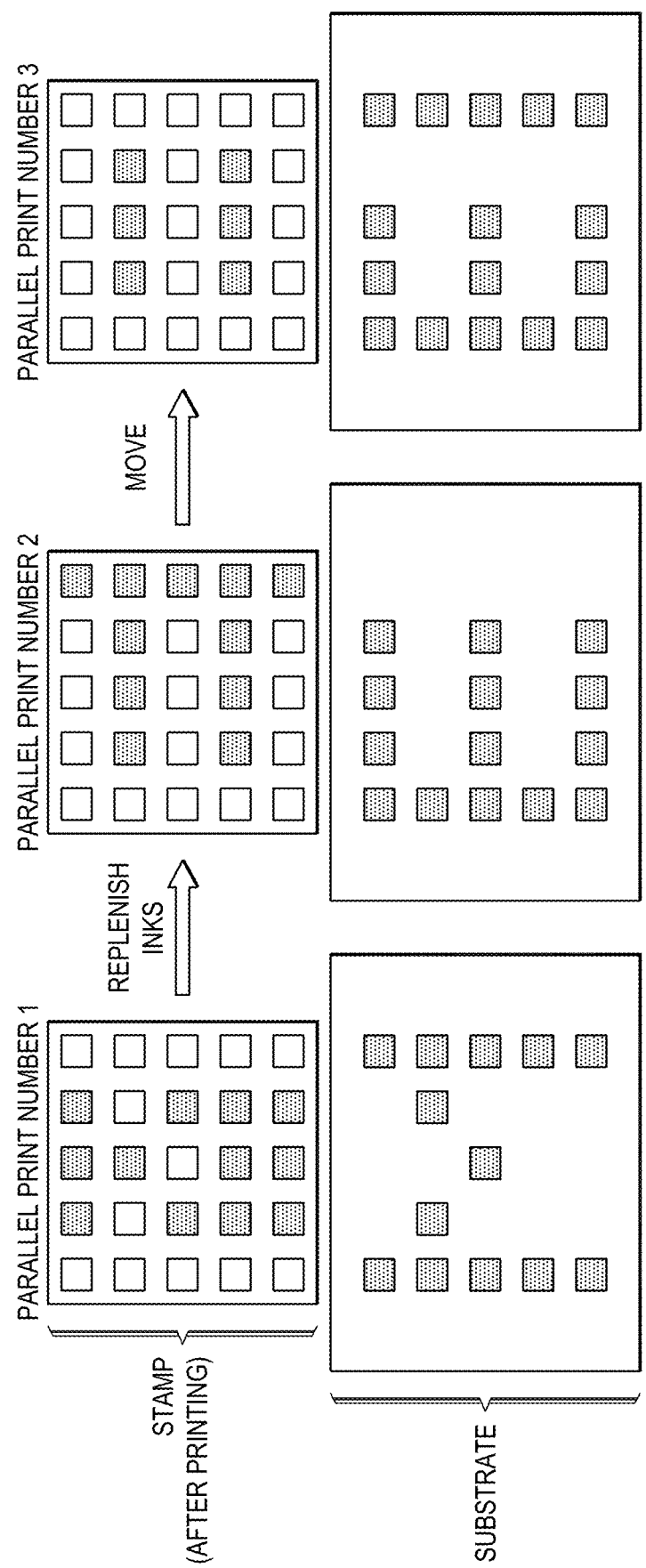
FIG. 8 shows use of a 5×5 array of CBSMP stamps to print "MECHSE" on a curved PDMS substrate with gold-coated Si inks using multiple parallel printing steps. The first three prints are clarified with a diagram underlying the images.

A first demonstration is spelling "MechSE," the Department of Mechanical Science and Engineering acronym, with gold-coated silicon inks on a flexible PDMS substrate, which is placed on a curved glass surface. The gold coating is approximately 100 nm in thickness and causes near total reflection of the NIR laser, thus providing an example of a printing task with a non-absorbing ink. The printing task is completed using a combination of parallel and serial printing, resulting in six letters printed using five sets of retrieved inks. This is clarified in FIG. 8, where the first three parallel prints are represented in a diagram. Printing "M" requires using inks from every column, thus the inks are replenished before the next step. However, the letter "E" only requires four columns of inks. Repositioning the stamp over the substrate allows the final column of unused inks to be printed as the first column of the letter "C," thus completing the second of two parallel prints from one set of inks. This method conserves inks when compared to a purely parallel print method where unused inks are discarded. A significant time savings is also realized by reducing the number of pickup steps since a significant portion of a typical process cycle is used to transition between pickup and printing of the ink arrays.

Figure 9A:
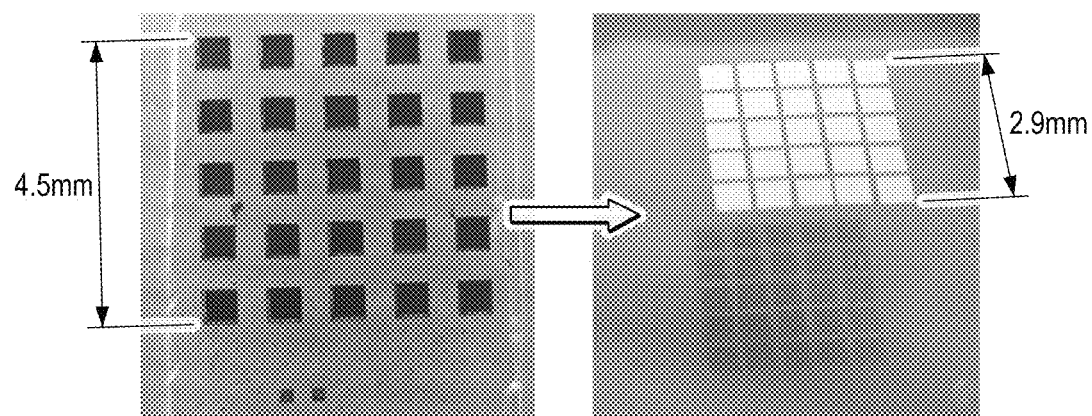
FIG. 9A shows inks printed individually in sequence to reduce ink spacing from 500 μm on the stamp array to 100 μm on the receiving substrate.

Serial printing is not limited to column-by-column print tasks. An example of a purely serial printing process is depicted in FIG. 9A. Silicon inks with an initial edge-to-edge spacing of 500 µm are first shown attached to the CBSMP stamp array. Each ink is then printed in series while registering the receiving substrate to reduce the spacing to 100 µm, as shown. A well designed industrial process utilizing a selective array-based transfer printing approach such the one presented here would most likely incorporate both serial and parallel elements.

Figure 9B:
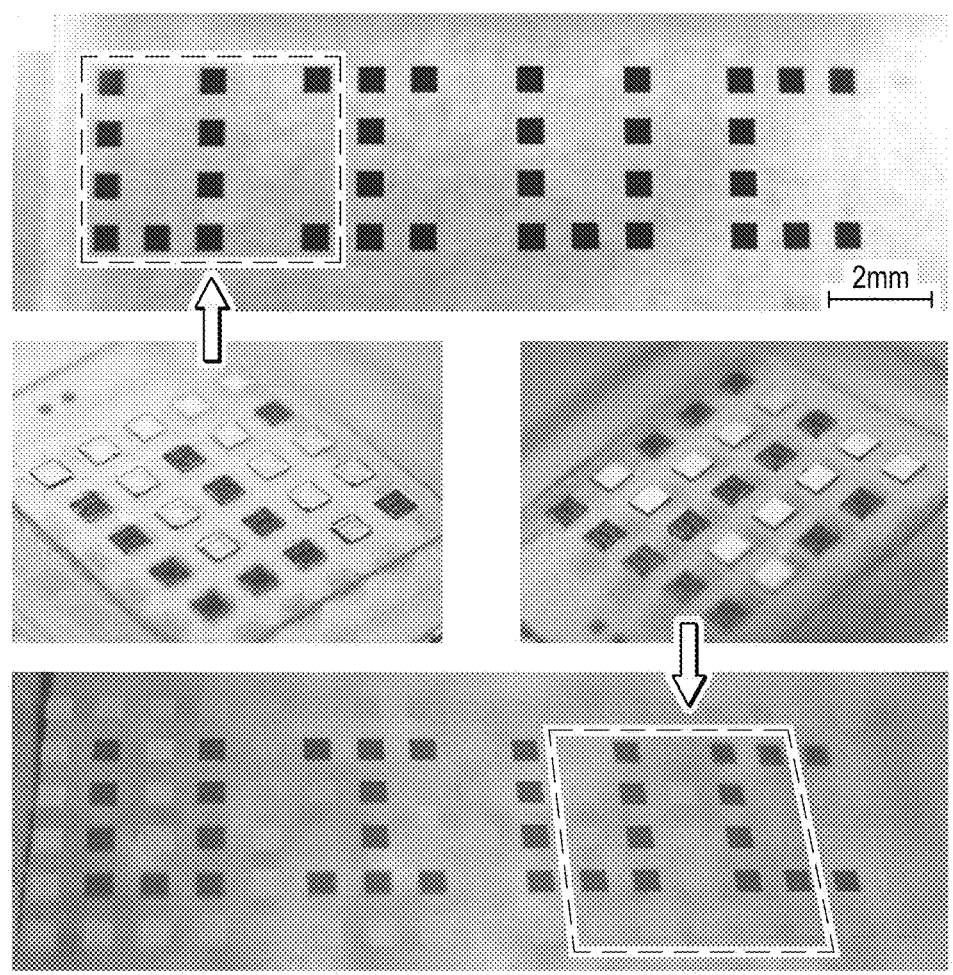
FIG. 9B shows "UIUC" printed with Si inks via three parallel print steps to a PDMS substrate. Gold-coated Si inks are then printed utilizing both parallel and individual print methods to surround the original design.

Multiple prints may be made over the same space of the receiving substrate. The University of Illinois Urbana-Champaign acronym, "UIUC," is printed with silicon inks on a PDMS receiving substrate using three parallel prints in FIG. 9B. Also depicted is the stamp array following one of the parallel prints. The inks are bright and reflective, while the locations of the missing printed inks are dark due to the CBSMP raised surface features. The stamp array images are flipped horizontally to ease understanding. The printed pattern does not interfere with a second overlaid print task, in this case a surrounding arrangement of gold-coated silicon inks. These inks are printed using four 5×5 sets of inks using a combination of parallel and serial printing.

Figure 10A:
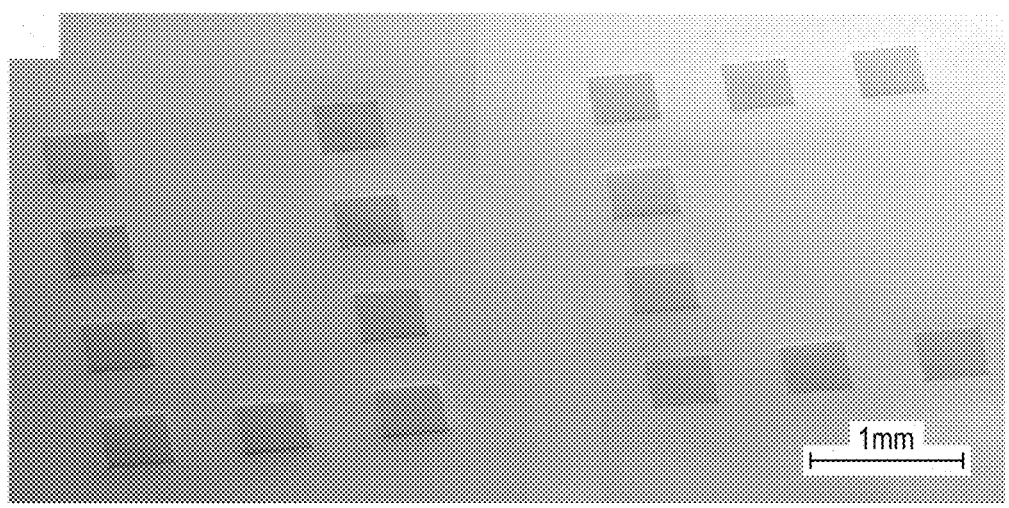
FIGS. 10A-10E include SEM and optical images of silicon inks on a silicon substrate, including an image of the letters "UC" printed in Si inks (FIG. 10A).
Figure 10B:
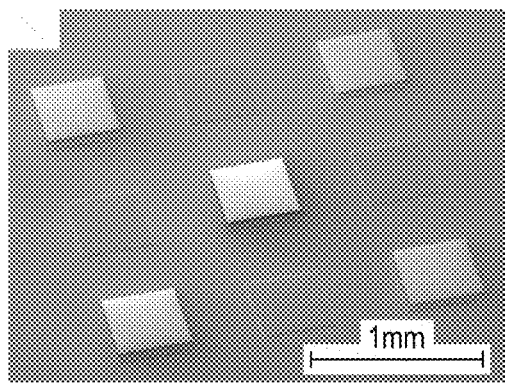
Figure 10C:
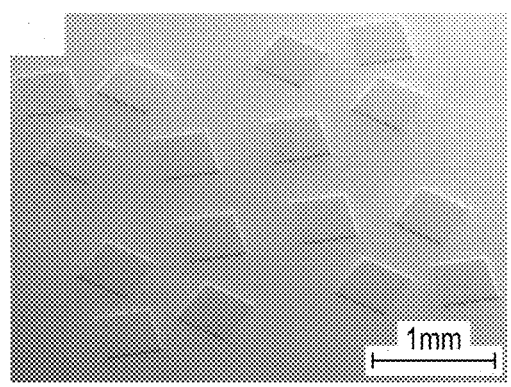
Figure 10D:
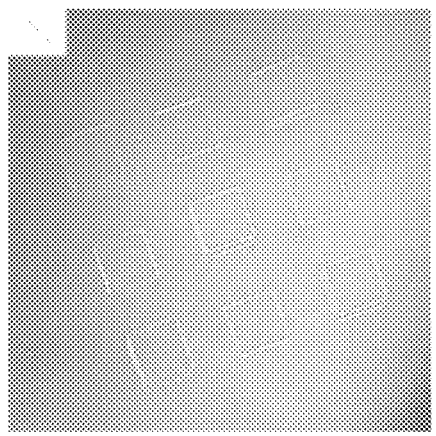
Figure 10E:
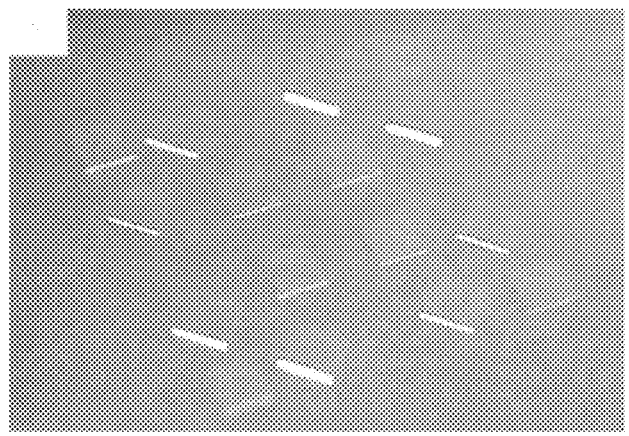

Much of the interest in transfer printing relates to the ability to assemble structures on semiconductor substrates. These substrates provide a particular challenge, due to the low surface adhesion they provide to aid ink release. The laser-driven CBSMP system is capable of selectively printing inks on these surfaces, with a few examples shown in FIGS. 10A-10E. The letters "UC" are printed as two separate print cycles, shown after thermally annealing at 900° C. to improve the ink-substrate bond. Multiple SEM images are stitched together due to the size of the pattern in FIG. 10A. Forming functional MEMS structures typically involves stacking more than one layer of inks. This is demonstrated in FIG. 10B with a simple cross pattern printed on an initial 3×3 array of inks. A final demonstration of printing on silicon is shown in FIG. 10C. A 4×4 array of inks is used to first print a pattern of eight inks as one parallel step, then the substrate is rotated 45 degrees to print the remaining inks also in parallel. Optical photographs are included in FIGS. 10D and 10E, demonstrating the bare silicon surfaces of both ink and substrate. The ability to overlay printed patterns on silicon is therefore demonstrated, as well as the ability to incorporate rotations into an assembly process utilizing a combination of parallel and serial printing elements.

The present method may be suited for transfer printing inks with thicknesses ranging from about 300 nm to about 20 µm. The operating principle of the raised surface feature stamp design requires the ink to be sufficiently stiff in bending such that the reconstitution of the surface features delaminates the ink from intermediate regions (e.g., the drums). For this reason, the microtip geometry reported here may not be a suitable choice to print very thin membranes, and particularly when made of very soft materials. This limitation can be mitigated by properly scaling the stamp's surface features, and thicker inks should suffer no such limitation. As described herein, the thermal limitations imposed on inks by the laser-driven CBSMP printing process are modest, only requiring that the ink briefly withstand temperatures of approximately 90° C. Inks made of very soft materials, and those with very low surface energy, can be expected to pose challenges during retrieval, similarly to other transfer printing methods.

Example 5

Materials and Methods

SMP stamp material: The epoxy-based SMP used for this work was created from a 1:1:1 molar ratio of EPON 826 (The diglycidyl ether of bisphenol A epoxy monomer; Momentive), Jeffamine D230 (poly(propylene glycol)bis(2-aminopropyl) ether; Huntsman), and NGDE (Neopentyl glycol diglycidyl ether; TCI America). Prior to mixing, the EPON 826 was heated at 60° C. for 30 minutes to remove any crystallization. The glass transition temperature $T_g$ zone spans 40° C.-65° C.

Fabrication of SMP stamps: Molds for the SMP stamps are fabricated on silicon wafers, based on established microfabrication methods. Microtips are etched into the silicon wafer surface using a KOH solution through a nitride mask. Drums are then etched using standard deep reactive ion etch (DRIE), with the microtips being formed by SU-8 50 processed to a depth of 45 µm. The SMP stamps are fabricated on glass substrates by a double molding process utilizing PDMS (Slygard 184 silicone elastomer kit). First, the SU-8 molds are treated with a non-stick layer (tridecafluoro-1,1,2,2-tetrahydrooctyltrichlorosilane; Sigma-Aldrich) by vapor deposition to facilitate mold release. PDMS is mixed in a 10:1 base to curing agent ratio and cured in the SU-8 molds at 50° C. for six hours. After demolding, the resulting PDMS molds are then etched using oxygen (20 sccm) for 30 seconds in a reactive ion etcher at 200 mTorr and 100 W to facilitate the bonding of a silane non-stick layer, resulting in low surface energy positive molds. These positive molds are used to make glass-mounted thin-film negative PDMS molds; to ensure surface flatness, they are again created with a 10:1 base to curing agent ratio and cured at 50° C. for six hours. This temperature is chosen to balance the effects of thermal expansion and curing shrinkage on the final product so that the SMP arrays spatially match with the ink arrays. The resulting negative molds are then lightly brushed with Cabot Vulcan XC72R powdered carbon black to coat all surfaces. Adhesive tape is repeatedly used to remove the excess carbon black, leaving only an adequate amount within the indentations in the mold that yield the raised surface features of the stamp. The mold is then filled with a small volume of SMP precursor and pressed against a glass substrate for curing. When cured for use with a microscale heater, the mold cavity is aligned over the heater prior to curing at 50° C. for 24 hours, followed by a 90 minute cure at 100° C.

Fabrication of silicon and gold-coated silicon inks: Square silicon inks are fabricated from silicon-on-insulator (SOI) wafers. The shape of silicon square blocks is determined by patterning a masking layer of photoresist (AZ 5214) and then etching the exposed silicon layer using deep reactive ion etch. Wet etching with hydrofluoric (HF) acid removes the buried oxide to form an undercut trench below the perimeters of the patterned silicon inks. The wafer is spin coated with photoresist (AZ 5214) and flood-exposed, leaving only PR under the undercut trench after development.

After final HF etching, silicon inks are suspended on photoresist, which is tethered to the underlying silicon wafer, and are ready for retrieval. For gold-coated silicon inks, the fabrication process is identical but with a final step including sputtering 5 nm of chrome followed by a 100 nm layer of gold. The chrome layer improves adhesion between the silicon and gold.

CBSMP microstructure absorption tests: The illumination source during testing is an 807 nm continuous wave laser diode. Its beam is directed to the sample through a 200 µm core optical fiber terminated with a 4 mm collimator and a focusing lens with a 30 mm focal distance. A dichroic mirror is placed in the beam path to direct it onto the sample while allowing simultaneous observation using a digital video camera. The test samples are continuously illuminated at low laser power (<250 mW) with the laser focused to have a spot width of approximately 600 µm diameter. The diode temperature is kept at 19.8±0.5° C. to maintain consistent illumination intensity. For the power absorption tests, the laser is on continuously for a minimum of one minute until it reaches a steady state temperature, and remains on while photo-diode power takes continuous measurements of transmitted 807 nm radiation for at least one additional minute. The data for each continuous test are averaged to provide a representative measurement of the total transmitted power for that sample. This is performed at several locations of each sample to ensure uniformity of the samples and repeatability of the results.

Thermogravimetric Analysis: A solid block of SMP is machined to produce approximately 4.17 g of small shavings and powder for analysis within a Cahn Thermomax 500 Thermogravimetric Analyzer. The test is carried out under oxygen and nitrogen simulated atmospheric conditions from 50° C. to 400° C. with a 10° C. min$^{-1}$ ramp. Temperature and weight measurements are recorded at one second increments.

A method of transfer printing on a receiving substrate that relies on thermally-induced shape change of SMP stamp arrays with light absorbing agent (e.g., carbon black-composite (CBSMP)) microstructuring has been described. Heat is delivered first globally by a resistive heater or other heat source, facilitating parallel micro-object pickup, and then locally by a concentrated light source, such as a laser. Light is absorbed within the light absorbing agent during printing, enabling precise and selective microobject release with packing density limited only by the spot size of the accompanying laser system. The disclosure also provides a stamp comprising a shape memory polymer comprising embedded light absorbing agents which is capable of transfer printing inks of any of a wide range of materials.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of transfer printing on a receiving substrate, the method comprising:

globally heating an array of stamps, each stamp in the array comprising a shape memory polymer having a light absorbing agent dispersed therein;

pressing the array of stamps to a donor substrate comprising a plurality of inks, thereby compressing each stamp from an undeformed adhesion-off configuration to a deformed adhesion-on configuration;

cooling the array of stamps, thereby rigidizing the shape memory polymer and binding the plurality of inks to the stamps in the deformed adhesion-on configuration;

positioning the array of stamps in proximity with a receiving substrate, the plurality of inks remaining bound to the stamps during the positioning; and after the positioning, locally heating a selected stamp in the array using a concentrated light source, the selected stamp returning to the undeformed adhesion-off configuration and the ink bound to the selected stamp being released and transfer printed onto the receiving substrate.

2. The method of claim 1, wherein globally heating the array of stamps comprises heating the array to at least a glass transition $T_g$ of the shape memory polymer, wherein cooling the array of stamps comprises cooling the array below the glass transition temperature $T_g$ of the shape memory polymer, and wherein locally heating the selected stamp in the array comprises locally heating the selected stamp to at least the glass transition temperature $T_g$ of the shape memory polymer.

3. The method of claim 1, wherein the concentrated light source comprises a laser, and wherein locally heating the selected stamp in the array comprises illuminating the selected stamp with near-infrared radiation.

4. The method of claim 1, wherein light from the concentrated light source is absorbed by the light absorbing agent dispersed in the shape memory polymer, thereby effecting the local heating of the selected stamp, and wherein the selected stamp is locally heated to a temperature in a range from about 60° C. to about 120° C.

5. The method of claim 1, wherein the stamps in the array other than the selected stamp remain in the deformed adhesion-on configuration during the local heating.

6. The method of claim 1, further comprising rastering the concentrated light source to locally heat more than one stamp in the array, there being a plurality of the selected stamps.

7. The method of claim 1, wherein the concentrated light source is disposed behind the array of stamps, the shape memory polymer being light-transmissive.

8. The method of claim 1, wherein a spacing of the stamps in the array is at least as large as a spot size of the concentrated light source.

9. The method of claim 1, wherein globally heating the array of stamps comprises resistive heating.

10. The method of claim 1, wherein the inks comprise a material selected from the group consisting of: semiconductor, metal, carbon, colloid, organic material, and biological material, and wherein the light absorbing agent is selected from the group consisting of: carbon black, carbon fibers, organic and inorganic absorption pigments, and dyes.

11. The method of claim 1, wherein each stamp includes a plurality of raised surface features, and wherein the light absorbing agent is localized to the raised surface features.

12. A method of transfer printing on a receiving substrate, the method comprising:

globally heating an array of stamps, each stamp in the array comprising a shape memory polymer;

pressing the array of stamps to a donor substrate comprising a plurality of inks, thereby compressing each stamp from an undeformed adhesion-off configuration to a deformed adhesion-on configuration;

cooling the array of stamps, thereby rigidizing the shape memory polymer and binding the plurality of inks to the stamps in the deformed adhesion-on configuration;

positioning the array of stamps in proximity with a receiving substrate, the plurality of inks remaining bound to the stamps during the positioning; and after the positioning, locally heating a selected stamp in the array, the selected stamp returning to the undeformed adhesion-off configuration and the ink bound to the selected stamp being released and transfer printed onto the receiving substrate.

13. The method of claim 12, further comprising a light absorbing agent dispersed in the shape memory polymer, and wherein locally heating the selected stamp in the array comprises irradiating the selected stamp with light from a concentrated light source, the light being absorbed by the light absorbing agent to effect the local heating.

14. The method of claim 12, further comprising an addressable electrically conductive heating element in thermal contact with each of the stamps in the array, and wherein locally heating the selected stamp in the array comprises passing a current through the respective electrically conductive heating element.

15. The method of claim 12, wherein globally heating the array of stamps comprises resistive heating, radiant heating, or convective heating of the array.

* * * * *